(12) United States Patent
Maeda et al.

(10) Patent No.: US 10,302,794 B2
(45) Date of Patent: May 28, 2019

(54) DETECTION SYSTEM FOR DETECTING A PERSON ON A SEAT

(71) Applicant: Takata Corporation, Tokyo (JP)

(72) Inventors: Genta Maeda, Shiga (JP); Masato Takao, Shiga (JP); Tomotoshi Senoo, Shiga (JP)

(73) Assignee: JOYSON SAFETY SYSTEMS JAPAN K. K., Tokyo (JP)

( * ) Notice: Subject to any disclaimer, the term of this patent is extended or adjusted under 35 U.S.C. 154(b) by 113 days.

(21) Appl. No.: 15/729,955

(22) Filed: Oct. 11, 2017

(65) Prior Publication Data

US 2018/0106924 A1 Apr. 19, 2018

(30) Foreign Application Priority Data

Oct. 17, 2016 (JP) .................................. 2016-203413
Jun. 13, 2017 (JP) .................................. 2017-116288

(51) Int. Cl.
*G01V 3/00* (2006.01)
*G01V 3/08* (2006.01)
*B60N 2/00* (2006.01)
*G01R 27/26* (2006.01)

(52) U.S. Cl.
CPC ............. *G01V 3/088* (2013.01); *B60N 2/002* (2013.01); *G01R 27/2605* (2013.01)

(58) Field of Classification Search
CPC ..... B60N 2/002; G01V 3/088; G01R 27/2605
USPC .............................................. 324/658–690
See application file for complete search history.

(56) References Cited

U.S. PATENT DOCUMENTS

| | | | |
|---|---|---|---|
| 2002/0170900 A1 | 11/2002 | Braeuchle et al. | |
| 2008/0100425 A1 | 5/2008 | Kiribayashi | |
| 2010/0049068 A1* | 2/2010 | Fuwamoto | A61B 5/0408 600/509 |
| 2012/0326735 A1* | 12/2012 | Bennett | B62D 1/046 324/705 |
| 2013/0098890 A1* | 4/2013 | Virnich | B60N 2/5685 219/204 |
| 2014/0253151 A1* | 9/2014 | Kandler | B62D 1/046 324/686 |
| 2015/0048845 A1* | 2/2015 | Petereit | H03K 17/955 324/663 |
| 2015/0102024 A1* | 4/2015 | Barfuss | B62D 1/046 219/204 |
| 2016/0101805 A1 | 4/2016 | Nishio et al. | |

FOREIGN PATENT DOCUMENTS

| | | |
|---|---|---|
| DE | 10121693 | 4/2003 |
| DE | 19983956 | 11/2009 |
| DE | 102007051827 | 3/2013 |

(Continued)

*Primary Examiner* — Jeff W Natalini
(74) *Attorney, Agent, or Firm* — IPUSA, PLLC

(57) ABSTRACT

A detection system includes a first electrode provided at a seat of a vehicle; a second electrode provided at an operation unit which is operated by being contacted, the second electrode being connected to a reference potential portion; and a detection device that measures combined capacitance between the reference potential portion and the first electrode and detects a presence of a person on the seat, and a contact between the person and the operation unit based on a measurement value of the combined capacitance.

13 Claims, 19 Drawing Sheets

(56) References Cited

FOREIGN PATENT DOCUMENTS

| | | |
|---|---|---|
| JP | 2003-520344 | 7/2003 |
| JP | 5223542 | 6/2013 |
| JP | 2014-190856 | 10/2014 |
| JP | 5941822 | 6/2016 |
| WO | 2000/038956 | 7/2000 |
| WO | 2000/038958 | 7/2000 |
| WO | 2012/177902 | 12/2012 |
| WO | 2015/087520 | 6/2015 |

* cited by examiner

DETECTION SYSTEM FOR DETECTING A PERSON ON A SEAT

CROSS-REFERENCE TO RELATED APPLICATION

The present application is based on and claims the benefit of priority of Japanese Priority Application No. 2016-203413 filed on Oct. 17, 2016 and Japanese Priority Application No. 2017-116288 filed on Jun. 13, 2017, the entire contents of which are hereby incorporated by reference.

BACKGROUND OF THE INVENTION

1. Field of the Invention

The present invention relates to a detection system.

2. Description of the Related Art

Conventionally, a technique is known by which a person on a seat of a vehicle is detected by measuring capacitance between an electrode provided at the seat and a circuit earth (see Patent Document 1, for example). Meanwhile, a technique is known by which a contact between a steering wheel of a vehicle and a person is detected by measuring capacitance between a sensor electrode at the steering wheel and a shield electrode (see Patent Document 2, for example).

However, in order to provide both of a function to detect a presence of a person, and a function to detect a contact between a person and an operation unit such as a steering wheel to a vehicle, according to the conventional techniques, separated detection devices for actualizing the functions, respectively, are necessary. However, if such separated detection devices are necessary, cost may be increased. Further, if such separated detection devices are necessary, it is difficult to ensure spaces for mounting these detection devices in a vehicle.

PATENT DOCUMENTS

[Patent Document 1] Japanese Unexamined Patent Application Publication (Translation of PCT Application) No. 2003-520344
[Patent Document 2] Japanese Unexamined Patent Publication No. 2014-190856

SUMMARY OF THE INVENTION

The present invention is made in light of the above problems, and provides a detection system capable of reducing cost and capable of being easily mounted on.

According to an embodiment, there is provided a detection system including a first electrode provided at a seat of a vehicle; a second electrode provided at an operation unit which is operated by being contacted, the second electrode being connected to a reference potential portion; and a detection device that measures combined capacitance between the reference potential portion and the first electrode and detects a presence of a person on the seat, and a contact between the person and the operation unit based on a measurement value of the combined capacitance.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1:
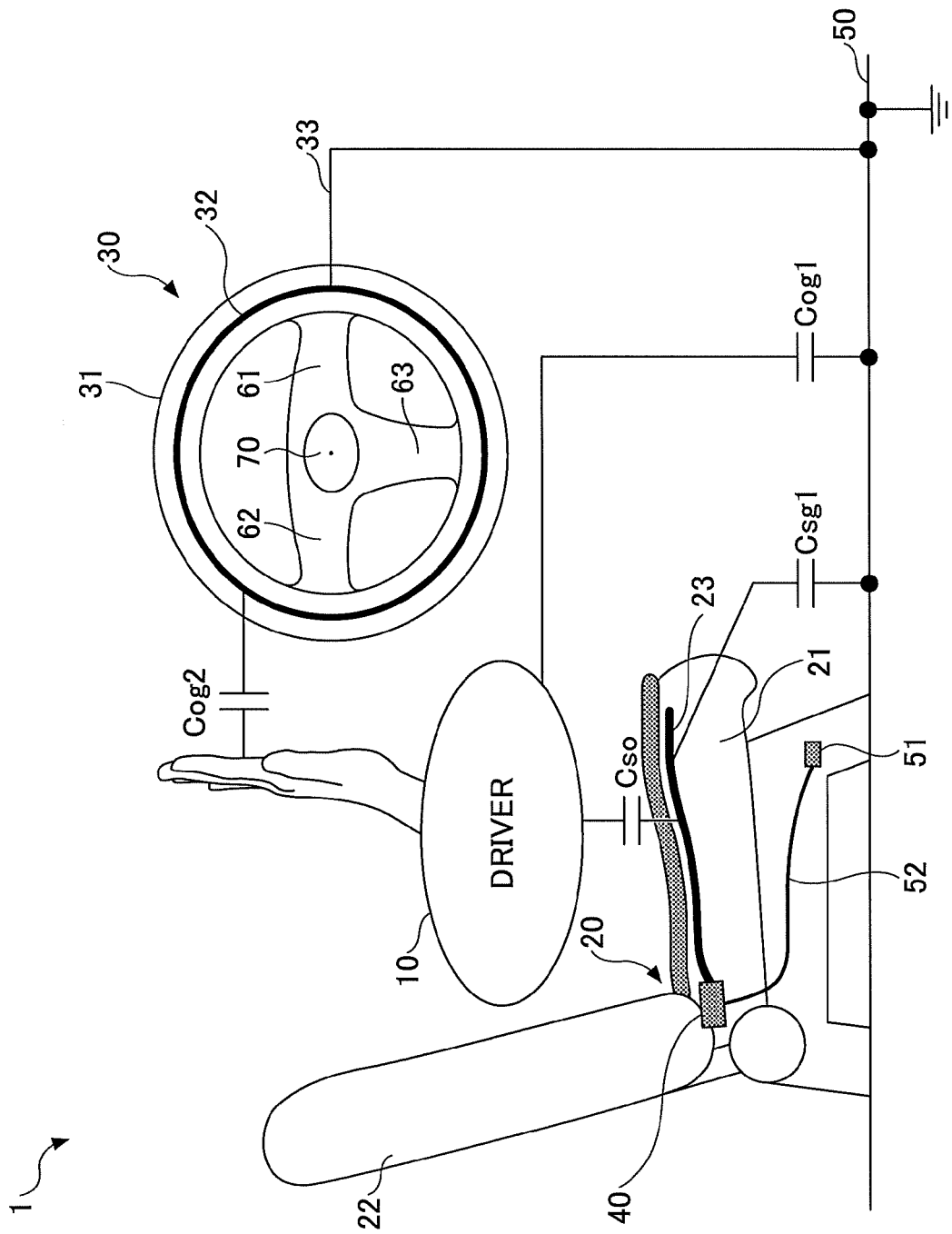
FIG. 1 is a view schematically illustrating an example of a structure of a detection system of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

(First Embodiment)

FIG. 1 is a view schematically illustrating an example of a structure of a detection system 1 of a first embodiment. The detection system 1 is an example of an on-vehicle system that detects a presence/nonpresence of a driver 10, and a contact/noncontact of the driver 10 and a steering wheel 30. The detection system 1 includes a seat electrode 23, a steering electrode 32 and an Electronic Control Unit (ECU) 40.

The seat electrode 23 is an example of a first electrode that is provided at a seat mounted on a vehicle. In this embodiment, the seat electrode 23 is an electrode for detecting the presence/nonpresence of the driver 10 on a seat 20, and at least one seat electrode 23 is included in a seat portion 21 of the seat 20. The seat electrode 23 is, for example, a mat-shaped electrical conductive portion, and provided inside the seat portion 21 such that to spread along an upper surface (seating surface) of the seat portion 21.

The steering electrode 32 is an example of a second electrode that is provided at an operation unit mounted on the vehicle, and is connected to a reference potential portion. In this embodiment, the steering electrode 32 is an electrode for detecting the contact/noncontact of the driver 10 and the steering wheel 30 (in particular, a rim 31), and at least one steering electrode 32 is included in the rim 31 of the steering wheel 30. The steering electrode 32 provided at the rim 31 is placed between an outer surface of the rim 31 and a core metal in the rim 31. The steering electrode 32 is, for example, a mat-shaped electrical conductive portion, and provided inside the rim 31 such that to extend in a circumferential direction of the rim 31 along the outer surface of the rim 31.

The steering wheel 30 is an example of an operation device that is operated by the driver 10 to steer the vehicle. The steering wheel 30 includes, for example, the rim 31, a hub 70, a right-spoke 61, a left-spoke 62 and a lower-spoke 63.

Here, "upper", "lower", "left" and "right" of the steering wheel 30 indicate directions when the steering wheel 30 is seen from its front side (from a driver 10 side) under a state that the steering wheel 30 is at a neutral position (a position to move the vehicle in a front direction).

The rim 31 is a portion gripped by the driver 10, and may be a portion formed in a circular shape, or a portion formed in another type of circular shape such as an ellipse shape, for example. The rim may be referred to as a grip as well.

The hub 70 is a portion that is formed at an inner center portion of the rim 31. A steering shaft of the vehicle is connected to the hub 70, and a horn plate at which an air bag module is fixed is also attached to the hub 70. The hub 70 is positioned to be offset with respect to the rim 31 toward a steering shaft side (a deeper side from the driver 10 on the seat 20).

The right-spoke 61 is a portion that connects the hub 70 and a right-rim portion of the rim 31. The left-spoke 62 is a portion that connects the hub 70 and a left-rim portion of the rim 31. The lower-spoke 63 is a portion that connects the hub 70 and a lower-rim portion of the rim 31. Here, the number of the spokes is not limited to three, and may be selectable such as four.

The steering electrode 32 is connected to a ground 50 via a connection line 33. As the steering electrode 32 is connected to the ground 50, electric potential of the steering electrode 32 becomes the same as that of the ground 50. The ground 50 is an example of a reference potential portion, and for example, is a metal body of the vehicle or a portion whose electric potential is the same as that of the metal body.

Although the steering electrode 32 is provided as a circular shape over the entirety of a perimeter of the rim 31 in the illustrated example, a part of the circular steering electrode 32 may be cut.

Further, when multiple steering electrodes 32 are provided in the rim 31, each of the steering electrodes 32 is connected to the ground 50. For example, when the steering electrode 32 is provided at each of the right-rim portion at a front side of the rim 31, the left-rim portion at the front side of the rim 31 and a rim portion at a back side of the rim 31, each of the steering electrodes 32 is connected to the ground 50. Here, the front side of the rim 31 means a nearer side from the driver 10 on the seat 20, and the back side of the rim 31 means a further side from the driver 10 on the seat 20.

The ECU 40 measures combined capacitance $Csg$ between the ground 50 and the seat electrode 23, and detects the presence/nonpresence of the driver 10 on the seat 20, and the contact/noncontact between the driver 10 and the steering wheel 30 based on a measurement value of the combined capacitance $Csg$. The ECU 40 is an example of a detection device, and for example, provided inside the seat 20 (the seat portion 21, for example). The ECU 40 sends a detection result of the presence/nonpresence of the driver 10 on the seat 20, and a detection result of the contact/noncontact between the driver 10 and the steering wheel 30, to an external device, not illustrated in the drawings, via a wire harness 52. The ECU 40 is connected to one end portion of the wire harness 52, and a connector 51 is connected to the other end portion of the wire harness 52. The external device, not illustrated in the drawings, is connected to the connector 51 directly or indirectly via the wire harness 52.

Figure 2:
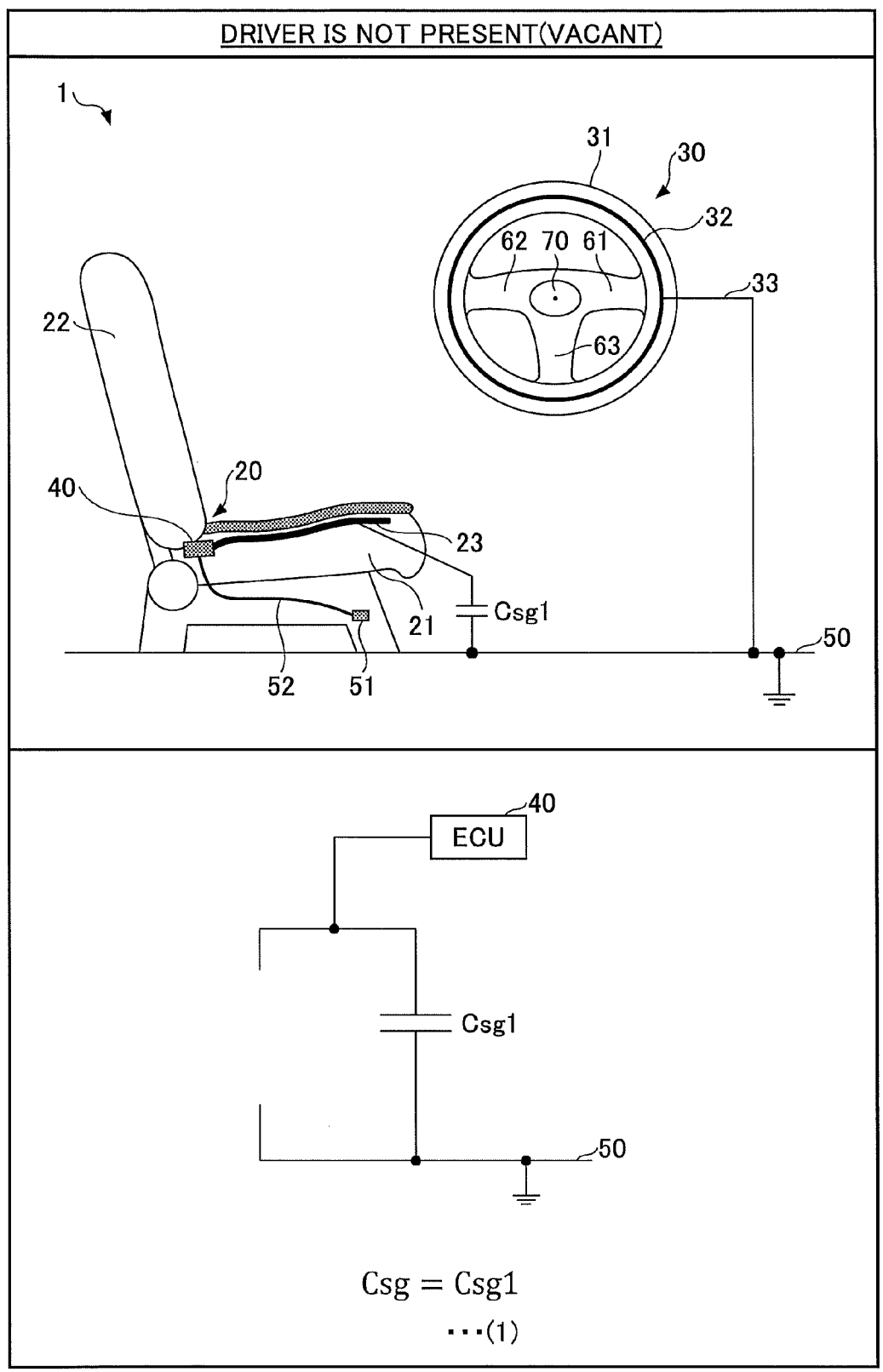
FIG. 2 is a view illustrating an example of an electrical circuit and its equivalent circuit formed when a seat is vacant.

FIG. 2 is a view illustrating an example of an electrical circuit and its equivalent circuit that is formed when the seat 20 is vacant, and illustrates a status in which the driver 10 is not present on the seat 20. Hereinafter, the status in which the driver 10 is not present on the seat 20 is referred to as a "nonpresence status". Here, as the driver 10 is not present on the seat 20 at the nonpresence status, the nonpresence status includes a status in which the driver 10 and the steering wheel 30 do not contact.

At the nonpresence status, capacitance $Csg1$ is formed between the seat electrode 23 and the ground 50. Thus, at the nonpresence status, the combined capacitance $Csg$ between the ground 50 and the seat electrode 23 can be expressed as an equation (1) in FIG. 2.

Figure 3:
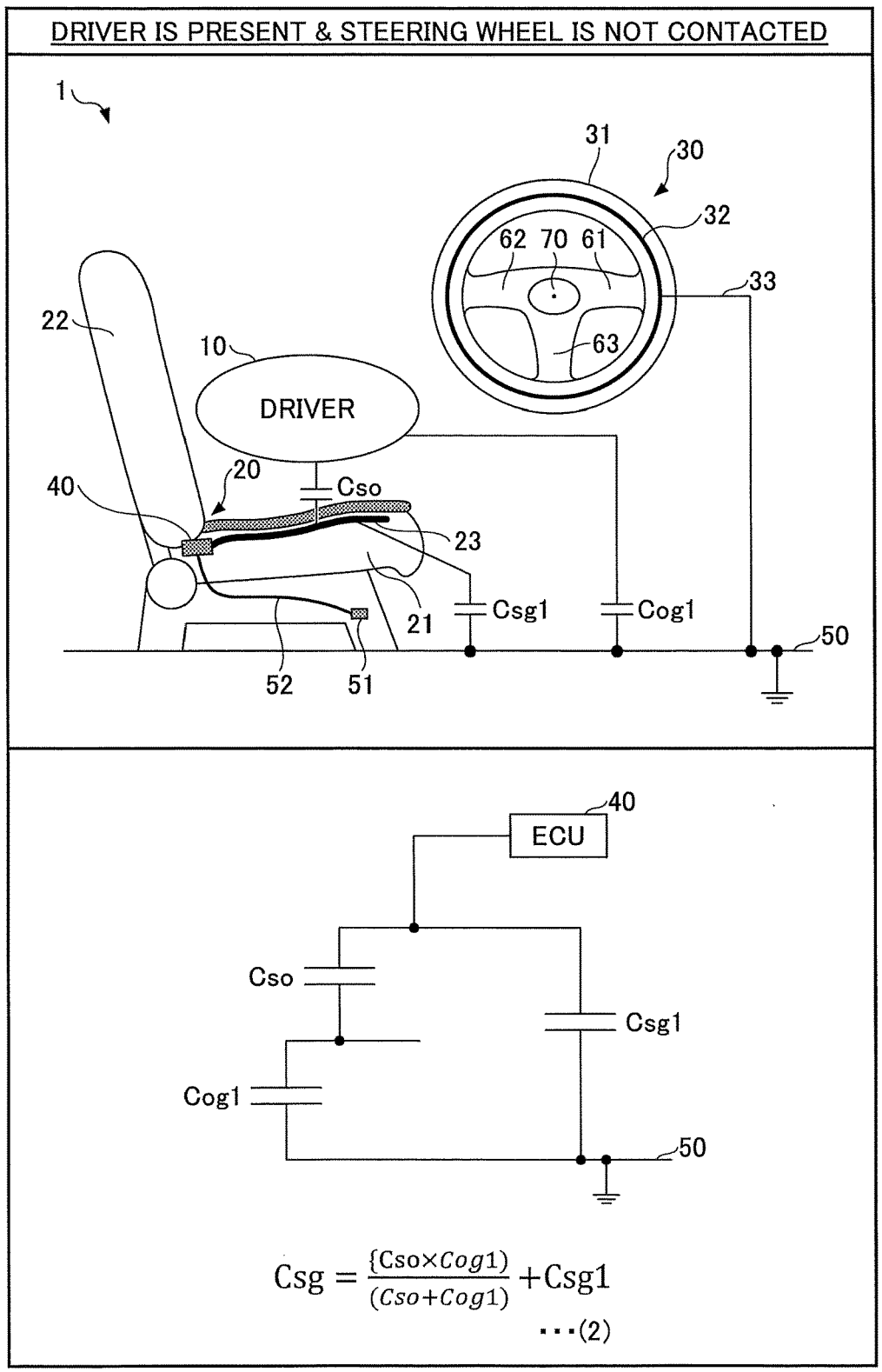
FIG. 3 is a view illustrating an example of an electrical circuit and its equivalent circuit formed when the seat is seated, and a steering wheel is not contacted.

FIG. 3 is a view illustrating an example of an electrical circuit and its equivalent circuit that is formed when the seat 20 is seated, and the steering wheel 30 is not contacted, and illustrates a status in which the driver 10 is present on the seat 20 and the driver 10 and the steering wheel 30 do not contact. Hereinafter, the status in which the driver 10 is present on the seat 20 and the driver 10 and the steering wheel 30 do not contact is referred to as an "presence & non-contacting status".

At the presence & non-contacting status, capacitance $Csg1$ is formed between the seat electrode 23 and the ground 50, and capacitance $Cso$ is formed between the seat electrode 23 and the driver 10, and capacitance $Cog1$ is formed between the driver 10 and the ground 50. Thus, at the presence & non-contacting status, the combined capacitance $Csg$ between the ground 50 and the seat electrode 23 can be expressed as an equation (2) in FIG. 3.

Figure 4:
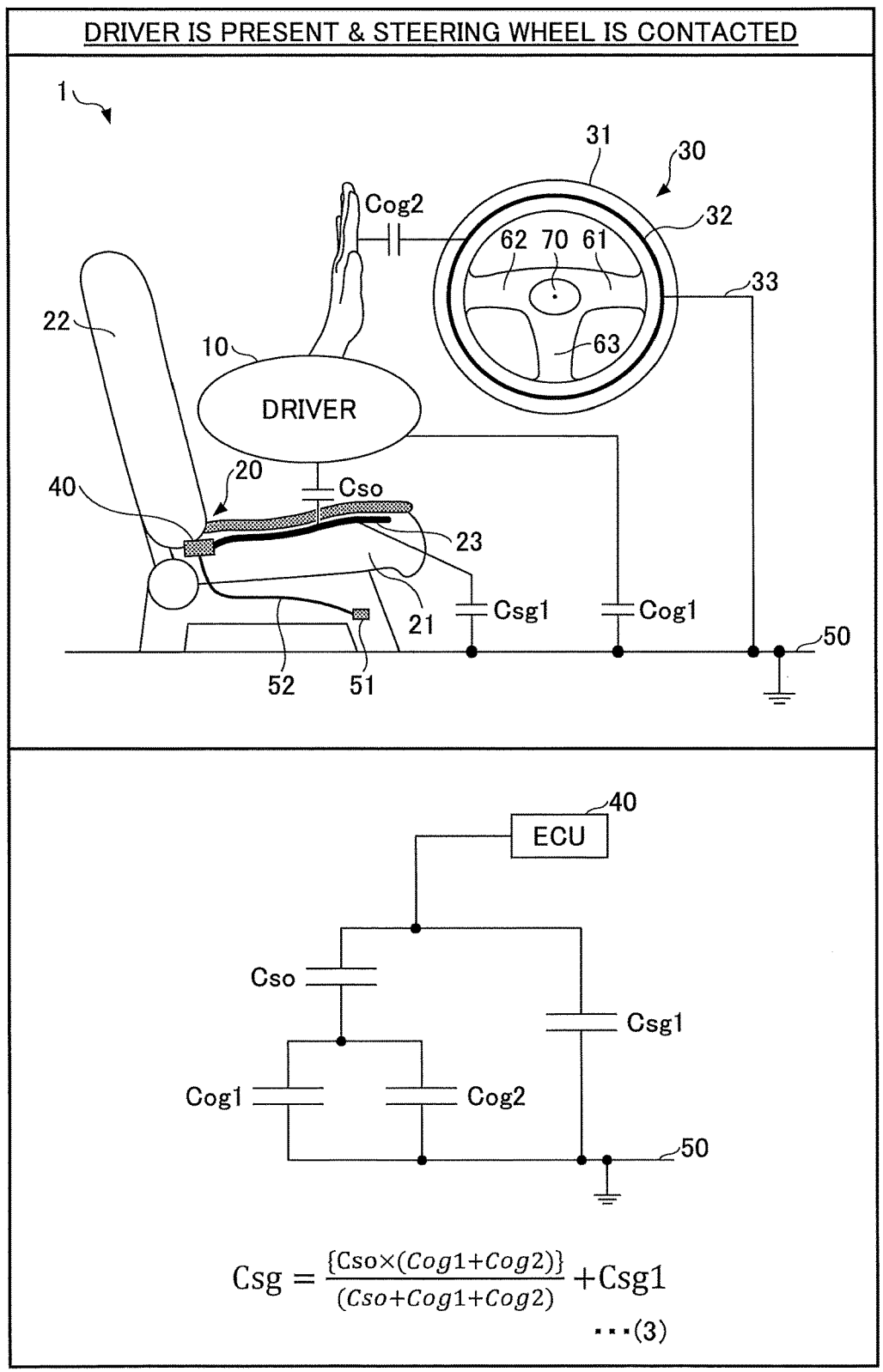
FIG. 4 is a view illustrating an example of an electrical circuit and its equivalent circuit formed when the seat is seated, and the steering wheel is contacted.

FIG. 4 is a view illustrating an example of an electrical circuit and its equivalent circuit that is formed when the seat 20 is seated, and the steering wheel 30 is contacted, and illustrates a status in which the driver 10 is present on the seat 20 and the driver 10 and the steering wheel 30 contact. Hereinafter, the status in which the driver 10 is present on the seat 20 and the driver 10 and the steering wheel 30 contact is referred to as an "presence & contacting status".

At the presence & contacting status, capacitance Csg1 is formed between the seat electrode 23 and the ground 50, capacitance Cso is formed between the seat electrode 23 and the driver 10, capacitance Cog1 is formed between the driver 10 and the ground 50, and capacitance Cog2 is formed between the driver 10 and the steering electrode 32. Thus, at the presence & contacting status, the combined capacitance Csg between the ground 50 and the seat electrode 23 can be expressed as an equation (3) in FIG. 4.

As can be understood from the equations (1), (2) and (3), values of the combined capacitance Csg are different for the three statuses illustrated in FIG. 2 to FIG. 4, and become larger in order of the equations (1), (2) and (3) (in other words, (1)<(2)<(3)). Thus, the ECU 40 can distinguish and detect the nonpresence status, the presence & non-contacting status and the presence & contacting status based on the measurement values of the combined capacitance Csg between the ground 50 and the seat electrode 23.

As such, according to the embodiment, the presence/nonpresence of the driver 10 on the seat 20 and the contact/noncontact between the driver 10 and the steering wheel 30 can be detected by the common single ECU 40. Thus, cost of the detection system 1 can be reduced, and it is easier to mount the detection system 1 on the vehicle.

Further, even when a person who is on the vehicle, other than the driver 10, touches the steering wheel 30, the combined capacitance Csg between the ground 50 and the seat electrode 23 of a driver seat (the seat 20 on which the driver 10 sits) does not vary. This means that even when the person other than the driver 10 touches the steering wheel 30, the ECU 40 distinguishes and detects the nonpresence status, the presence & non-contacting status and the presence & contacting status based on the difference in the measurement value of the combined capacitance Csg.

Figure 5:
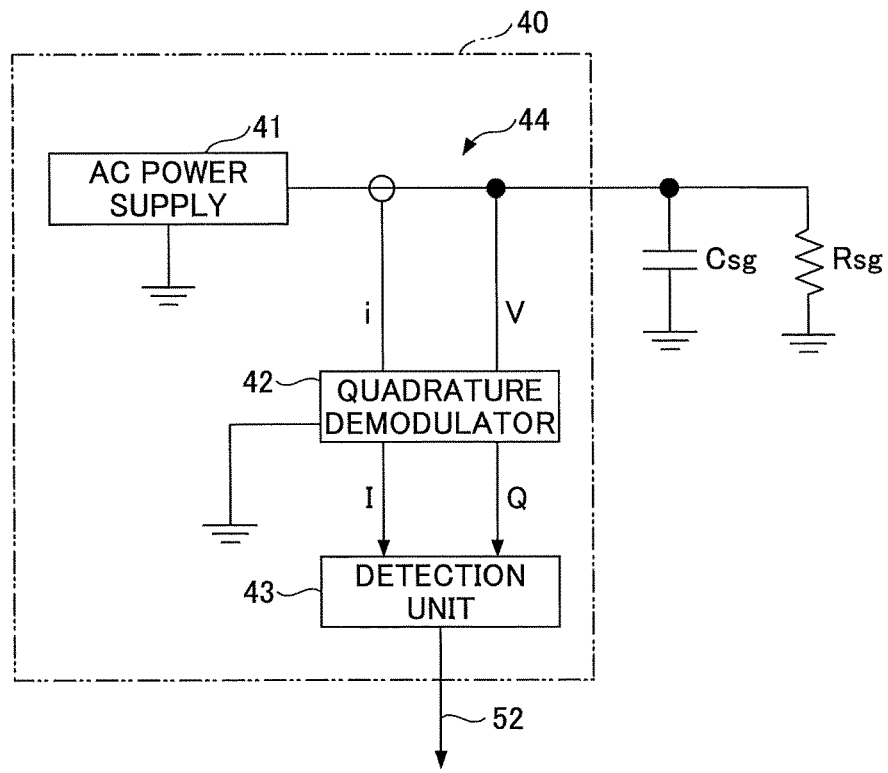
FIG. 5 is a view illustrating an example of a structure of a detection device.

FIG. 5 is a view illustrating an example of a structure of a detection device. The seat electrode 23 is connected to the ECU 40, which is an example of the detection device. "Csg" expresses the combined capacitance between the ground 50 and the seat electrode 23, and "Rsg" expresses combined resistance which is a sum of resistance of the seat electrode 23 itself and resistance between the seat electrode 23 and the ground 50. The ECU 40 includes a measurement unit 44 and a detection unit 43.

The measurement unit 44 measures the combined capacitance Csg by applying alternating voltage between the ground 50 and the seat electrode 23, and measuring current that flows through the combined capacitance Csg between the ground 50 and the seat electrode 23. The detection unit 43 distinguishes and detects the nonpresence status, the presence & non-contacting status and the presence & contacting status based on the measurement value of the combined capacitance Csg measured by the measurement unit 44.

The measurement unit 44 includes, for example, an alternating-current power supply (AC power supply) 41 and a quadrature demodulator 42.

The AC power supply 41 converts direct-current voltage of a direct-current power supply such as a battery, not illustrated in the drawings, mounted on the vehicle to alternating voltage of approximately 100 kHz, and applies the converted alternating voltage between the seat electrode 23 and the ground 50.

The quadrature demodulator 42 monitors alternating voltage V between the seat electrode 23 and the ground 50, and current i provided to the seat electrode 23. Then, the quadrature demodulator 42 outputs information regarding an in-phase component I of the current i with respect to the alternating voltage V, and a quadrature component Q of the current i with respect to the alternating voltage V, to the detection unit 43.

The detection unit 43 distinguishes and detects the nonpresence status, the presence & non-contacting status and the presence & contacting status based on a value of the in-phase component I and a value of the quadrature component Q, and outputs a signal indicating the detection result to the external device, not illustrated in the drawings, via the wire harness 52. The detection unit 43 is, or alternatively, both the detection unit 43 and the quadrature demodulator 42 are, for example, actualized by a microcomputer.

Here, the combined capacitance Csg between the seat electrode 23 and the ground 50 is equivalent to the quadrature component Q of the current i (Csg=Q). Further, the combined resistance Rsg between the seat electrode 23 and the ground 50 is equivalent to inverse of the in-phase component I of the current i (Rsg=1/I).

Thus, the detection unit 43 distinguishes and detects the nonpresence status, the presence & non-contacting status and the presence & contacting status by, for example, comparing the quadrature component Q (an example of the measurement value of the combined capacitance Csg) with predetermined threshold values.

For example, when the quadrature component Q is less than a first threshold value Th1, the detection unit 43 determines that a current status is the nonpresence status. When the quadrature component Q is greater than or equal to the first threshold value Th1 and less than a second threshold value Th2, the detection unit 43 determines that the current status is the presence & non-contacting status. When the quadrature component Q is greater than or equal to the second threshold value Th2, the detection unit 43 determines that the current status is the presence & contacting status. The first threshold value Th1 is set to be a value between a right-side value of the equation (1) in FIG. 2, and a right-side value of the equation (2) in FIG. 3. The second threshold value Th2 is set to be a value between the right-side value of the equation (2) in FIG. 3 and a right-side value of the equation (3) in FIG. 4.

Further, when a surface of the seat 20 or the steering wheel 30 is wet, or a material that composes the seat 20 or the steering wheel 30 is moistened, a phenomenon that impedance between the ground 50 and the seat electrode 23 is lowered occurs. Thus, the above described threshold values may be set by taking such a phenomenon into consideration. In such a case, for setting the threshold values, lines (curves) indicating IQ characteristics as illustrated in FIG. 6 are used, for example.

Figure 6:
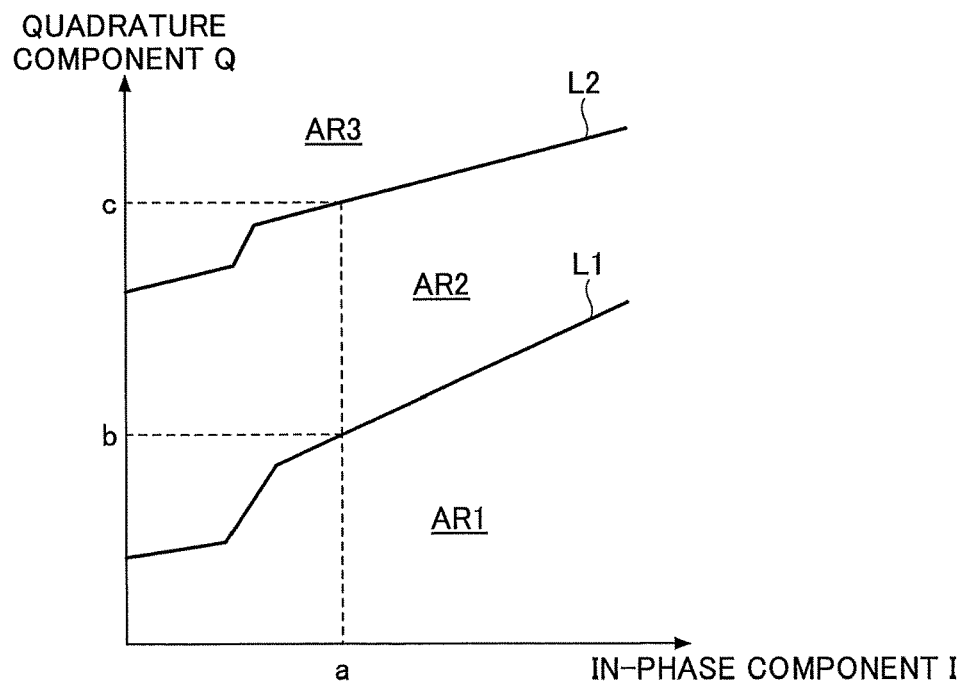
FIG. 6 is a view illustrating an example of a relationship between a quadrature component and an in-phase component.

FIG. 6 is a view illustrating an example of a relationship between the quadrature component Q and the in-phase component I. In an area AR1, points specified by the quadrature component Q and the in-phase component I at the nonpresence status exist. In an area AR2, points specified by the quadrature component Q and the in-phase component I at the presence & non-contacting status exist. In an area AR3, points specified by the quadrature component Q and the in-phase component I at the presence & contacting status exist. A relationship rule for determining the IQ characteristics illustrated in FIG. 6 is defined by a map or arithmetic expression.

The detection unit 43 determines the first threshold value based on a curve L1 that divides the area AR1 and the area AR2, and determines the second threshold value based on a curve L2 that divides the area AR2 and the area AR3. For example, when a value of the in-phase component I is "a", the detection unit 43 sets the first threshold value to be "b"

on the curve L1 corresponding to "a", and sets the second threshold value to be "c" on the curve L2 corresponding to "a".

Then, when the quadrature component Q is less than the first threshold value "b", the detection unit 43 determines that the current status is the nonpresence status. When the quadrature component Q is greater than or equal to the first threshold value "b" and less than the second threshold value "c", the detection unit 43 determines that the current status is the presence & non-contacting status. When the quadrature component Q is greater than or equal to the second threshold value "c", the detection unit 43 determines that the current status is the presence & contacting status.

The detection unit 43 outputs discriminated information, which is a result of discriminating the nonpresence status, the presence & non-contacting status and the presence & contacting status as described above, to the external device, not illustrated in the drawings, via the wire harness 52.

The external device may use, for example, the discriminated information obtained from the detection unit 43 as one of decision conditions used in driving support control of the vehicle.

Specifically, a driving support ECU (an example of the external device) permits transition from a driving support control whose driving support level is high (automatic driving, for example) to a driving support control whose driving support level is low (manual driving, for example) under a condition that at least the current status is the presence & contacting status. On the other hand, the driving support ECU prohibits transition from the driving support control whose driving support level is high to the driving support control whose driving support level is low if the current status is the presence & non-contacting status or the nonpresence status. With this, transition from the driving support control whose driving support level is high (driving support control at level 3, for example) to the driving support control whose driving support level is low (driving support control at level 2, for example) can be prevented under a state that the driver 10 does not touch the steering wheel 30.

Here, the driving support level may be defined, for example, according to an automation level regulated by the National Highway Traffic Safety Administration (NHTSA). The higher the value of the level is, the higher the driving support level becomes. The driving support level indicates an automation level of automatic driving. The higher the driving support level is, the higher the automation level of the automatic driving becomes. The driving support level is increased step-wisely from level 0 to level 4. The level 0 indicates a state at which there is no driving operation support.

Further, the external device may use, for example, the discriminated information obtained from the detection unit 43 as one of decision conditions used in automatic start control, which is one of the driving support controls. Specifically, the driving support ECU permits automatic start from a stop state under a condition that at least the current status is the presence & contacting status. On the other hand, the driving support ECU prohibits automatic start from a stop state when the current status is the presence & non-contacting status or the nonpresence status. With this, for example, the vehicle can be prevented from being automatically started from a stop state under a state that the driver 10 does not touch the steering wheel 30.

Alternatively, the external device may use, for example, the discriminated information obtained from the detection unit 43 as one of decision conditions for determining whether to alert for wearing a seat belt, decision conditions for determining whether to open an air bag, or decision conditions for cruise control.

(Second Embodiment)

Figure 7:
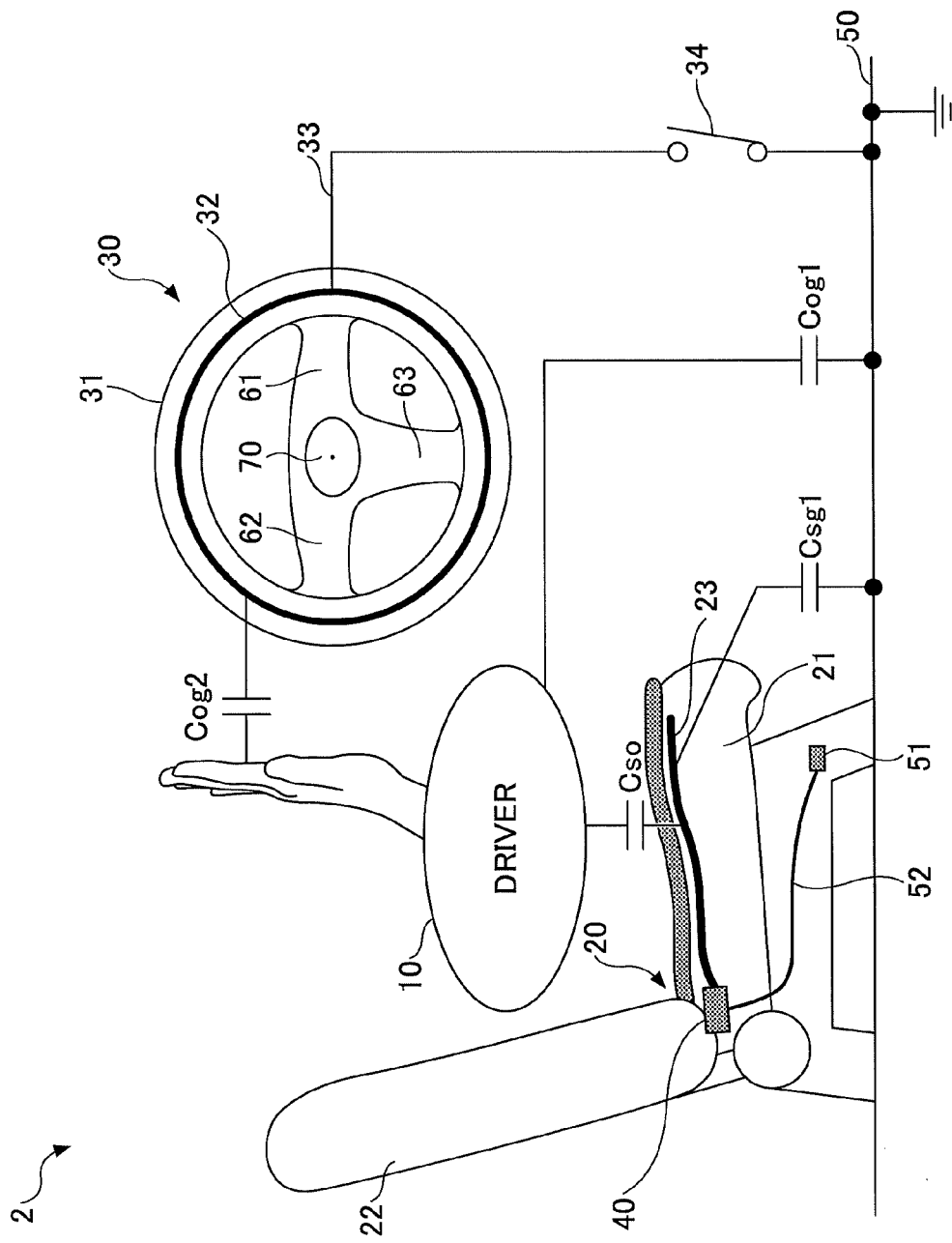
FIG. 7 is a view schematically illustrating an example of a structure of a detection system a second embodiment.
Figure 8:
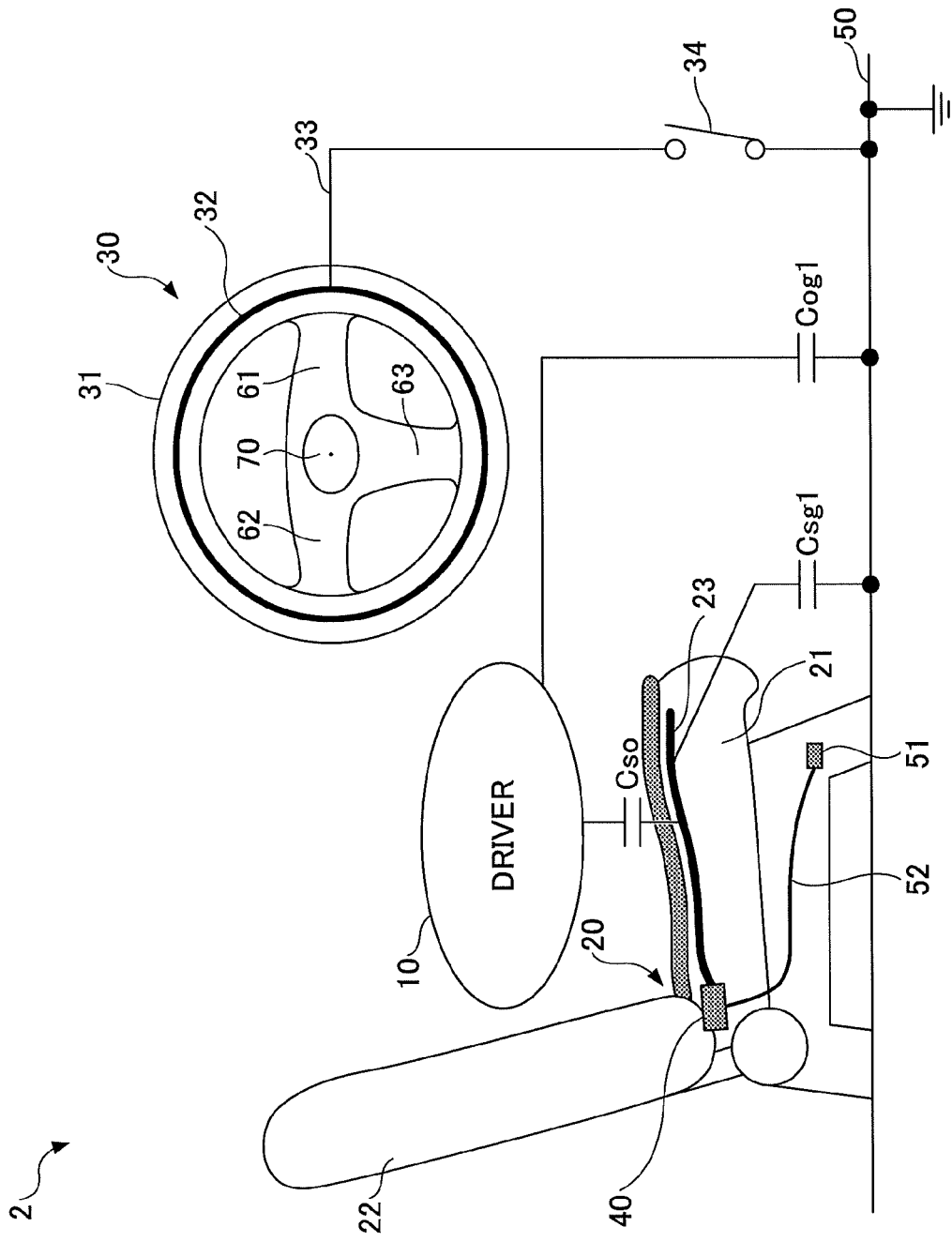
FIG. 8 is a view schematically illustrating an example of a structure of the detection system of the second embodiment.

FIG. 7 and FIG. 8 are views schematically illustrating an example of a structure of a detection system 2 of a second embodiment. In the second embodiment, the same structures and the same effects as those of the above described embodiment may also be applicable and are not repeatedly described.

When the driver 10 changes his/her position on the seat 20, the measurement value of the combined capacitance Csg is changed. Thus, for example, when the driver 10 changes his/her position on the seat 20 while touching the rim 31, there may be a case that it is difficult for the ECU 40 to determine whether the driver 10 and the steering wheel 30 contact.

Thus, in order to solve such a problem, the detection system 2 includes a switch 34 inserted between the steering electrode 32 and the ground 50. The switch 34 is inserted in the connection line 33 in series so that the switch 34 can shut down or connect the steering electrode 32 and the ground 50. In this embodiment, the steering electrode 32 and the ground 50 are connected under a state in which the switch 34 is on, and the steering electrode 32 and the ground 50 are shut down under a state in which the switch 34 is off.

When the multiple steering electrodes 32 are provided, the switch 34 is inserted between each of the steering electrodes 32 and the ground 50.

The switch 34 may be included inside the ECU 40, or may be provided outside the ECU 40. As a specific example of the switch 34, a relay, a transistor or the like may be exemplified.

Under a status of FIG. 7 in which the driver 10 and the steering wheel 30 contact, as the capacitance Cog2 changes under a state in which the switch 34 is on and a state in which the switch 34 is off, the measurement value of the combined capacitance Csg is also changed. Meanwhile, under a status of FIG. 8 in which the driver 10 and the steering wheel 30 do not contact, as the capacitance Cog2 is not formed, the measurement value of the combined capacitance Csg does not change under a state in which the switch 34 is on and a state in which the switch 34 is off.

Based on this point, the ECU 40 compares the measurement values of the combined capacitance Csg when the switch 34 is on and when the switch 34 is off, and detects the contact/noncontact between the driver 10 and the steering wheel 30 based on the compared result.

For example, when it is detected that there is a difference between the measurement values of the combined capacitance Csg when the switch 34 is on and when the switch 34 is off, the ECU 40 determines that the driver 10 and the steering wheel 30 contact (see FIG. 7). On the other hand, when it is determined that there is no difference between the measurement values of the combined capacitance Csg when the switch 34 is on and when the switch 34 is off, the ECU 40 determines that the driver 10 and the steering wheel 30 do not contact (see FIG. 8).

By detecting the contact/noncontact between the driver 10 and the steering wheel 30 as such, even when the driver 10 changes his/her position on the seat 20 while touching the rim 31, the contact/noncontact can be easily detected.

Figure 9:
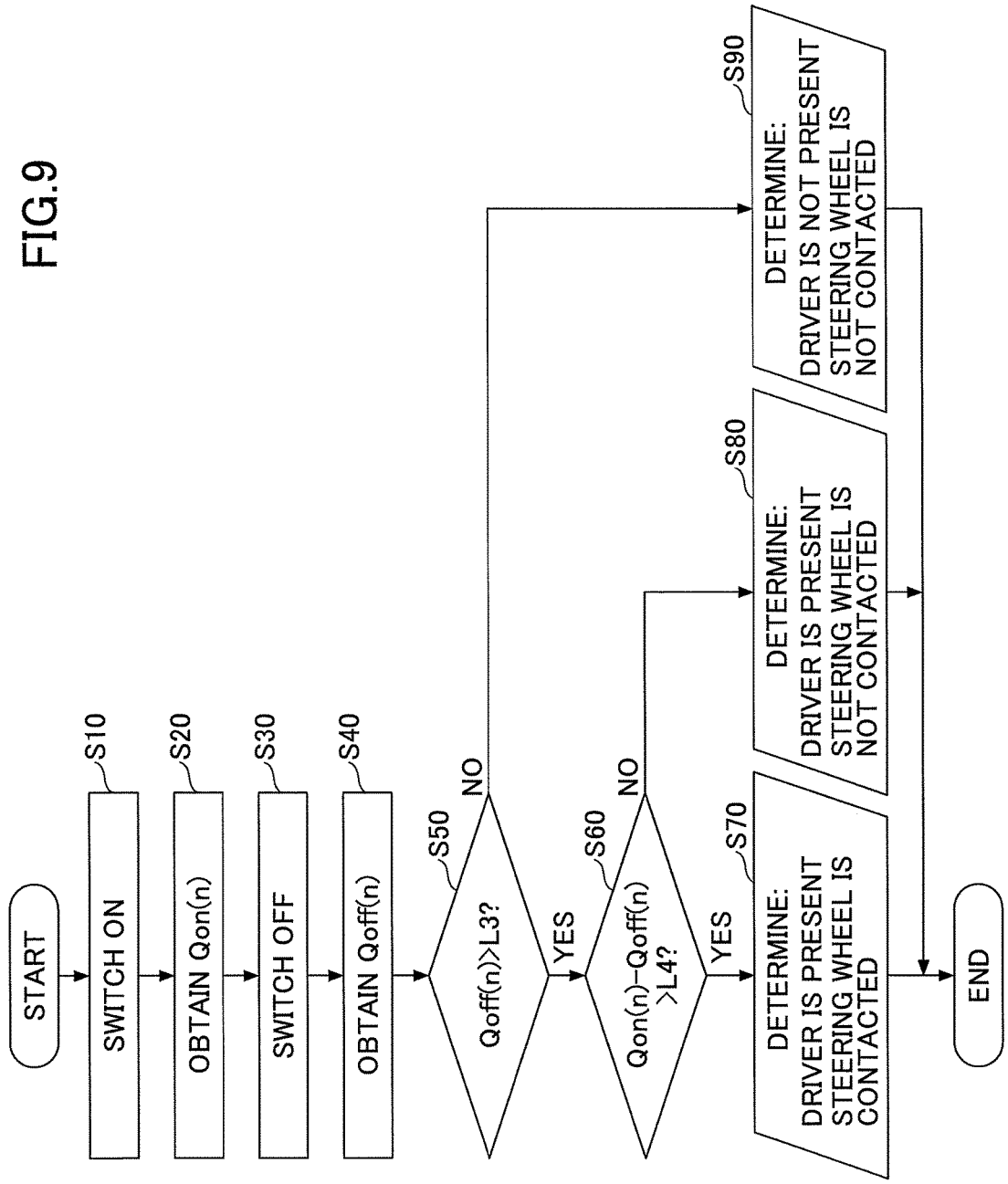
FIG. 9 is a flowchart illustrating an example of an operation of a detection device of the second embodiment.

FIG. 9 is a flowchart illustrating an example of an operation of the ECU 40. The ECU 40 repeatedly performs processes between start to end at a predetermined period. When an ignition switch is on, the ECU 40 whose power source is on starts the processes illustrated in FIG. 9.

In step S10, the detection unit 43 outputs an on-command signal which causes the switch 34 on. In step S20, the detection unit 43 obtains a quadrature component Q (=Qon (n)) at the time when the switch 34 is an from the quadrature demodulator 42. For example, the detection unit 43 obtains the quadrature component Q (=Qon(n)) when outputting the on-command signal from the quadrature demodulator 42.

In step S30, the detection unit 43 outputs an off-command signal which causes the switch 34 off. In step S40, the detection unit 43 obtains a quadrature component Q (=Qoff (n)) at the time when the switch 34 is off from the quadrature demodulator 42. For example, the detection unit 43 obtains the quadrature component Q (=Qoff(n)) when outputting the off-command signal from the quadrature demodulator 42.

In step S50, the detection unit 43 determines whether the quadrature component Qoff(n) obtained in step S40 is greater than a first predetermined value L3. When it is determined that the quadrature component Qoff(n) is less than or equal to the first predetermined value L3 (NO of step S50), the detection unit 43 determines that the current status is the nonpresence status (step S90). On the other hand, when it is determined that the quadrature component Qoff(n) is greater than the first predetermined value L3 (YES of step S50), the detection unit 43 performs a process of step S60.

In step S60, the detection unit 43 determines whether "Qon(n)−Qoff(n)" is greater than a second predetermined value L4. When it is determined that the "Qon(n)−Qoff(n)" is less than or equal to the second predetermined value L4 (NO of step S60), the detection unit 43 detects that there is no difference between the measurement values of the combined capacitance Csg when the switch 34 is on and when the switch 34 is off. When it is determined that there is no difference between the measurement values of the combined capacitance Csg in step S60, the detection unit 43 determines that the current status is the presence & non-contacting status (step S80). Meanwhile, when it is determined that the "Qon(n)−Qoff(n)" is greater than the second predetermined value L4 (YES of step S60), the detection unit 43 determines that there is a difference between the measurement values of the combined capacitance Csg when the switch 34 is on and when the switch 34 is off. When it is determined that there is a difference between the measurement values of the combined capacitance Csg in step S60, the detection unit 43 determines that the current status is the presence & contacting status (step S70).

Here, although whether the quadrature component Qoff (n) obtained in step S40 is greater than the first predetermined value L3 is determined in step S50 in the above description, instead of the quadrature component Qoff(n) obtained in step S40, the quadrature component Qon(n) obtained in step S20 may be used. In such a case, whether the quadrature component Qon(n) is greater than a predetermined value may be determined in step S50. Then, when the quadrature component Qon(n) is less than or equal to the predetermined value, the process may proceed to step S90, and when the quadrature component Qon(n) is greater than the predetermined value, the process may proceed to step S60.

Here, the first predetermined value L3 and the second predetermined value L4 may be threshold values set without considering the above described in-phase component I, or may be threshold values corrected in accordance with the in-phase component I as illustrated in FIG. 6.

As such, according to the detection system 2, the presence/nonpresence of the driver 10 on the seat 20 and the contact/noncontact between the driver 10 and the steering wheel 30 can be detected by the common single ECU 40. Thus, cost of the detection system 2 can be reduced, and it is easier to mount the detection system 2 on the vehicle. Further, according to the detection system 2, even when the driver 10 changes his/her position on the seat 20 while touching the rim 31, the contact/noncontact between the driver 10 and the steering wheel 30 can be easily detected.

(Third Embodiment)

Figure 10:
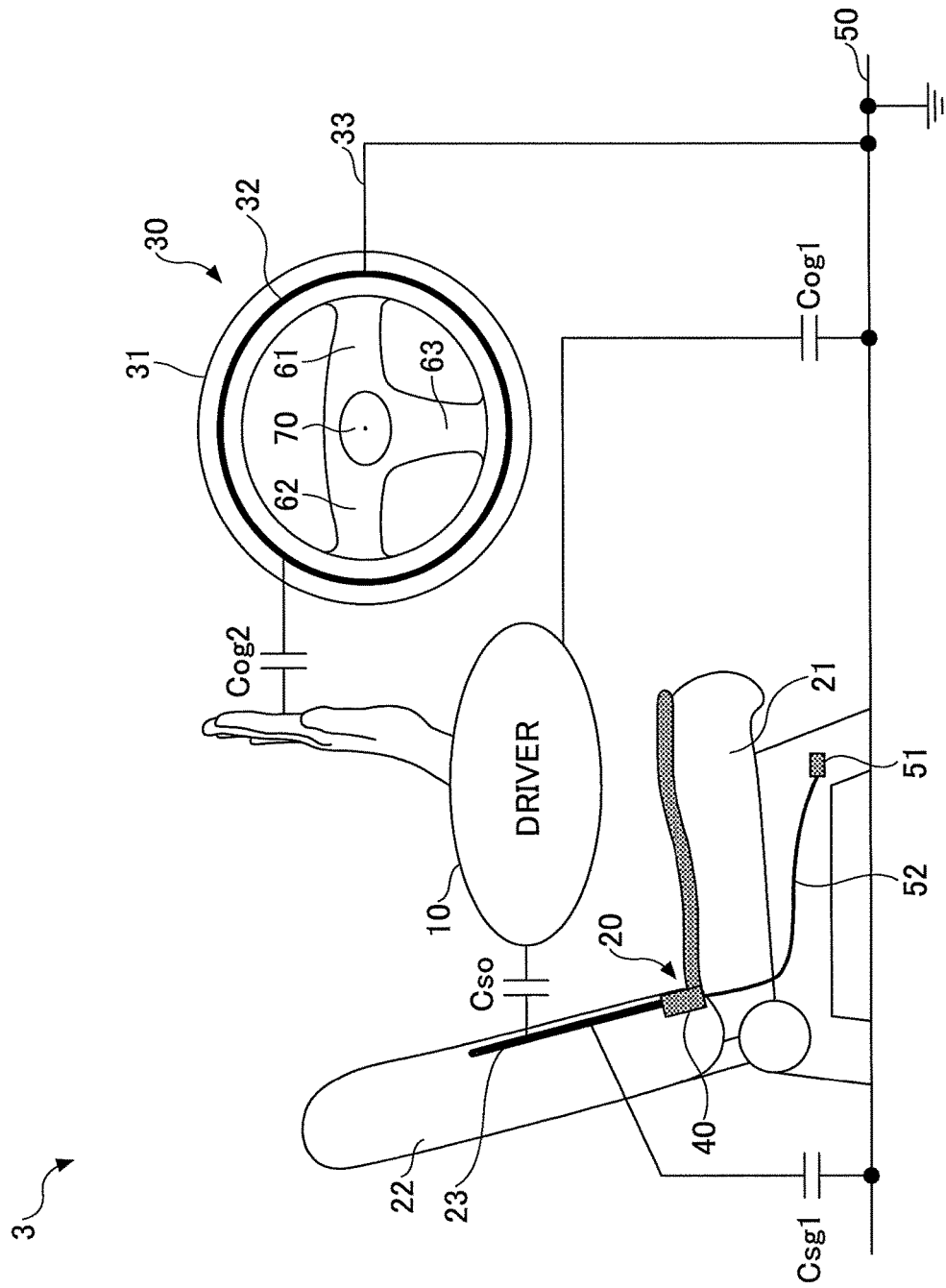
FIG. 10 is a view schematically illustrating an example of a structure of a detection system of a third embodiment.

FIG. 10 is a view schematically illustrating an example of a structure of a detection system 3 of a third embodiment. In the third embodiment, the same structures and the same effects as those of the above described embodiments may also be applicable and are not repeatedly described.

The detection system 3 illustrated in FIG. 10 is different from the detection system 1 illustrated in FIG. 1 in that the seat electrode 23 is provided at a seat back 22 of the seat 20. The ECU 40 is provided inside the seat back 22, for example.

According to the detection system 3 as well, the presence/nonpresence of the driver 10 on the seat 20 and the contact/noncontact between the driver 10 and the steering wheel 30 can be detected by the common single ECU 40. Thus, cost of the detection system 3 can be reduced, and it is easier to mount the detection system 3 on the vehicle.

(Fourth Embodiment)

Figure 11:
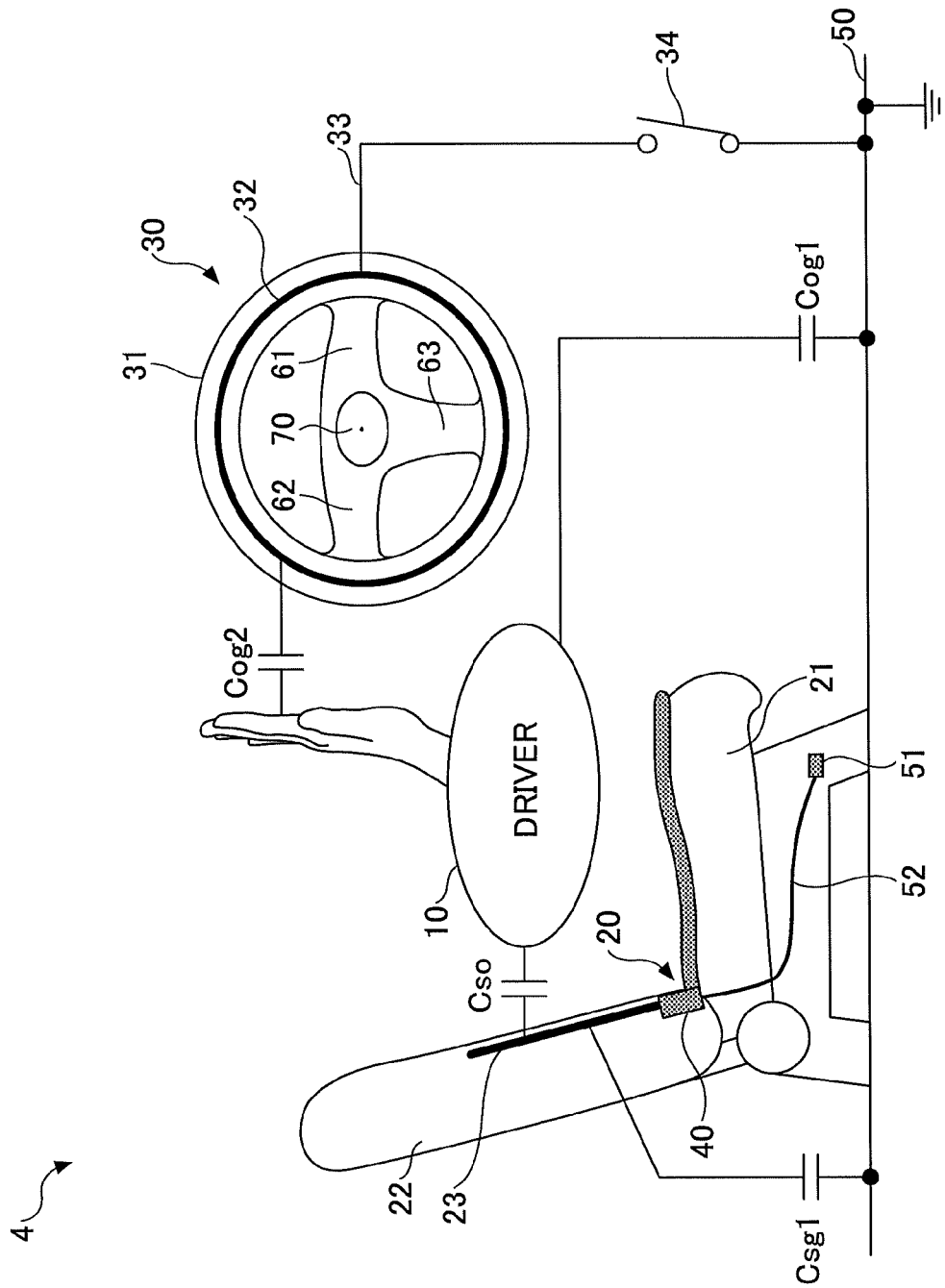
FIG. 11 is a view schematically illustrating an example of a structure of a detection system of a fourth embodiment.

FIG. 11 is a view schematically illustrating an example of a structure of a detection system 4 of a fourth embodiment. In the fourth embodiment, the same structures and the same effects as those of the above described embodiments may also be applicable and are not repeatedly described.

The detection system 4 illustrated in FIG. 11 is different from the detection system 2 illustrated in FIG. 7 and FIG. 8 in that the seat electrode 23 is provided at the seat back 22 of the seat 20. The ECU 40 is provided inside the seat back 22, for example.

According to the detection system 4 as well, the presence/nonpresence of the driver 10 on the seat 20 and the contact/noncontact between the driver 10 and the steering wheel 30 can be detected by the common single ECU 40. Thus, cost of the detection system 4 can be reduced, and it is easier to mount the detection system 4 on the vehicle.

(Fifth Embodiment)

Figure 12:
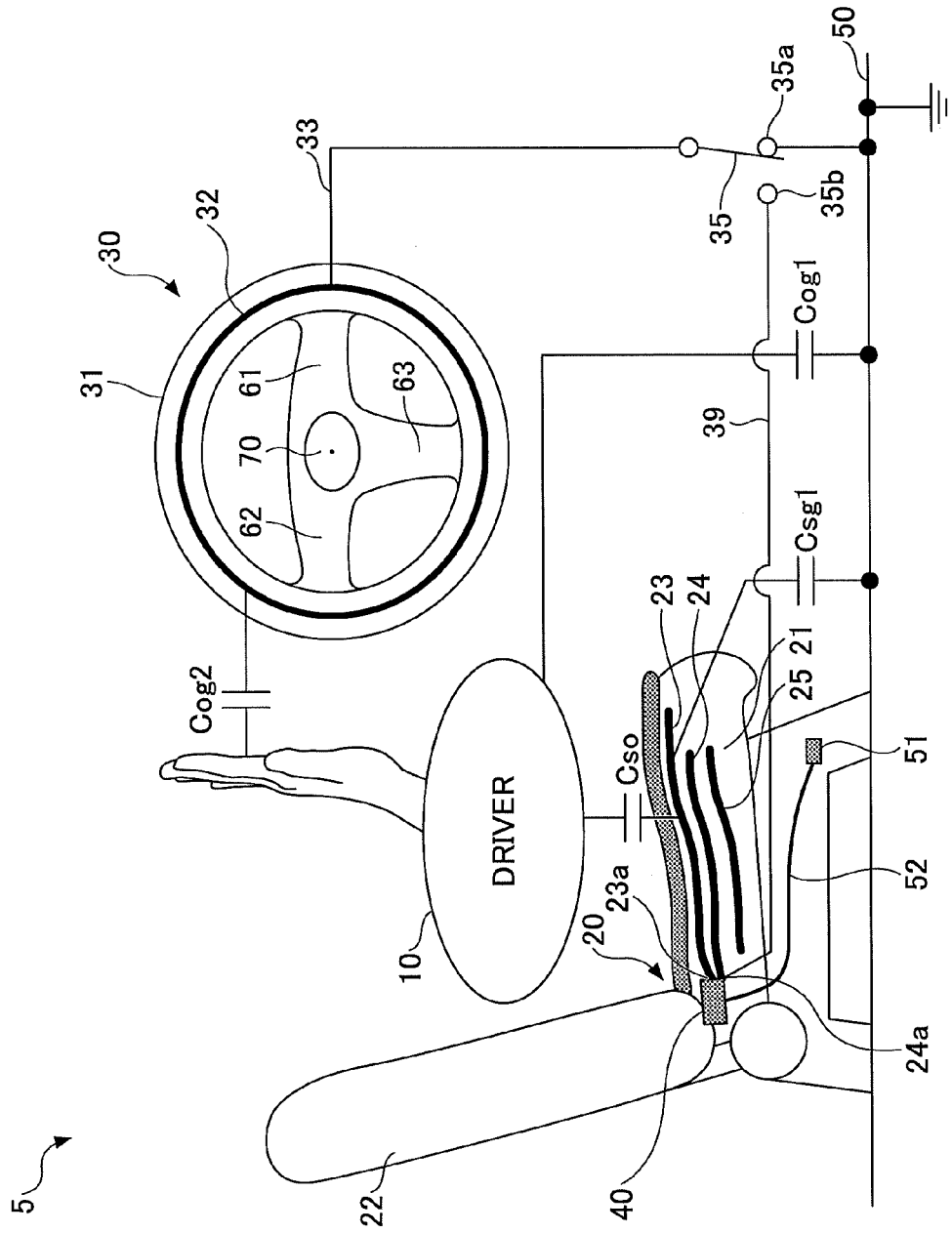
FIG. 12 is a view schematically illustrating an example of a structure of a detection system of a fifth embodiment.
Figure 13:
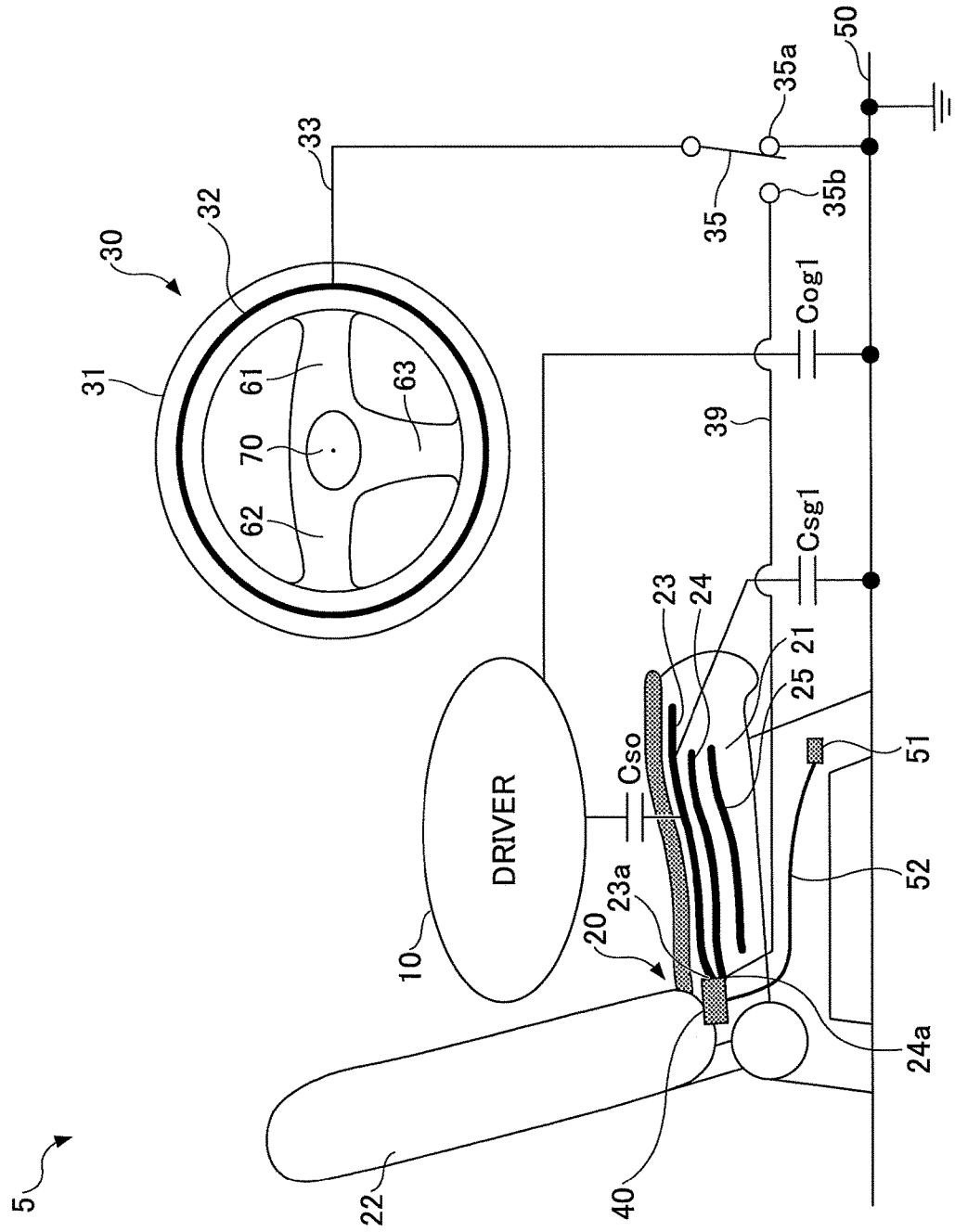
FIG. 13 is a view schematically illustrating an example of a structure of the detection system of the fifth embodiment.

FIG. 12 and FIG. 13 are views schematically illustrating an example of a structure of a detection system 5 of a fifth embodiment. In the fifth embodiment, the same structures and the same effects as those of the above described embodiments may also be applicable and are not repeatedly described.

When the driver 10 changes his/her position on the seat 20, the measurement value of the combined capacitance Csg is changed, and there may be a case that it is difficult for the ECU 40 to determine whether the driver 10 and the steering wheel 30 contact. For example, a case when the driver 10 changes his/her position on the seat 20 while touching the rim 31, or a case when the driver 10 touches a site other than the rim 31, without touching the rim 31, and a capacitive coupling is generated between the driver 10 and the site, may be considered.

Thus, in order to solve such a problem, the detection system 5 includes a shield portion 24 and a switch 35 inserted between the steering electrode 32 and the ground 50. The switch 35 is inserted in the connection line 33 in series so that the steering electrode 32 can be connected to the ground 50 or to the shield portion 24.

The shield portion 24 is a member that shields the seat electrode 23. The shield portion 24 electrostatically shields the seat electrode 23 from forming a capacitive coupling with another electrical conductor. As a specific example of the other electrical conductor, a seat heater 25 that heats the seat 20 (the seat portion 21, for example) by being power supplied or the like may be exemplified. Each of the shield portion 24 and the seat heater 25 is a mat-shaped electrical conductive portion. The shield portion 24 is provided between the seat electrode 23 and the seat heater 25 so as to shut down a capacitive coupling between the seat electrode 23 and the seat heater 25.

The ECU 40 includes a sensor terminal 23a connected to the seat electrode 23, and a shield terminal 24a connected to the shield portion 24. The ECU 40 provides alternating voltage to the seat electrode 23 via at least one sensor terminal 23a, and provides alternating voltage to the shield portion 24 via at least one shield terminal 24a. With this, the seat electrode 23 can be effectively shielded by the shield portion 24. In order to increase a shield effect of the shield portion 24, the ECU 40 provides the alternating voltage of the same or substantially the same frequency at the same or substantially the same phase to the seat electrode 23 and the shield portion 24, respectively.

The switch 35 connects the steering electrode 32 to either one of the ground 50 and the shield portion 24. The switch 35 is, for example a three-way switch, and includes a ground contact 35a connected to the ground 50, and a shield contact 35b connected to the shield portion 24. Although the shield contact 35b is connected to the shield terminal 24a via a connection line 39, the shield contact 35b may be connected to the shield portion 24 via the connection line 39.

When the multiple steering electrodes 32 are provided, the switch 35 is inserted between each of the multiple steering electrodes 32 and the ground 50.

The switch 35 may be provided inside the ECU 40, or provided outside the ECU 40. As a specific example of the switch 35, a relay, a transistor or the like may be exemplified.

FIG. 12 illustrates a status in which the driver 10 and the steering wheel 30 contact. Under the status of FIG. 12, at least capacitance between the driver 10 and the steering electrode 32 changes under a state in which the switch 35 is switched to the ground contact 35a and a state in which the switch 35 is switched to the shield contact 35b, and thus the measurement value of the combined capacitance Csg is also changed. Meanwhile, FIG. 13 illustrates a status in which the driver 10 and the steering wheel 30 do not contact. Under the status of FIG. 13, there is no capacitive coupling between the driver 10 and the steering electrode 32. Thus, the measurement value of the combined capacitance Csg does not change under the state in which the switch 35 is switched to the ground contact 35a and the state in which the switch 35 is switched to the shield contact 35b.

Based on this point, the ECU 40 compares the measurement values of the combined capacitance Csg under the state in which the switch 35 is switched to the ground contact 35a and under the state in which the switch 35 is switched to the shield contact 35b. The ECU 40 detects the contact/noncontact between the driver 10 and the steering wheel 30 based on the compared result.

For example, the ECU 40 detects whether there is a different between the measurement values of the combined capacitance Csg under the state in which the switch 35 is switched to the ground contact 35a and under the state in which the switch 35 is switched to the shield contact 35b. When it is detected that there is a difference between the measurement values of the combined capacitance Csg, the ECU 40 determines that the driver 10 and the steering wheel 30 contact (see FIG. 12). On the other hand, when it is determined that there is no difference between the measurement values of the combined capacitance Csg, the ECU 40 determines that the driver 10 and the steering wheel 30 do not contact (see FIG. 13).

By detecting the contact/noncontact between the driver 10 and the steering wheel 30 as such, even when the driver 10 changes his/her position on the seat 20 while touching the rim 31, the contact/noncontact between the driver 10 and the steering wheel 30 can be easily detected. Further, even when the driver 10 touches a site other than the rim 31 without contacting the rim 31, and capacitive coupling is generated between the driver 10 and the site, the contact/noncontact between the driver 10 and the steering wheel 30 can be easily detected.

Here, the state in which the switch 35 is switched to the ground contact 35a means a state in which the steering electrode 32 and the ground 50 are connected by the switch 35. The state in which the switch 35 is switched to the shield contact 35b means a state in which the steering electrode 32 and the shield portion 24 are connected by the switch 35.

Figure 14:
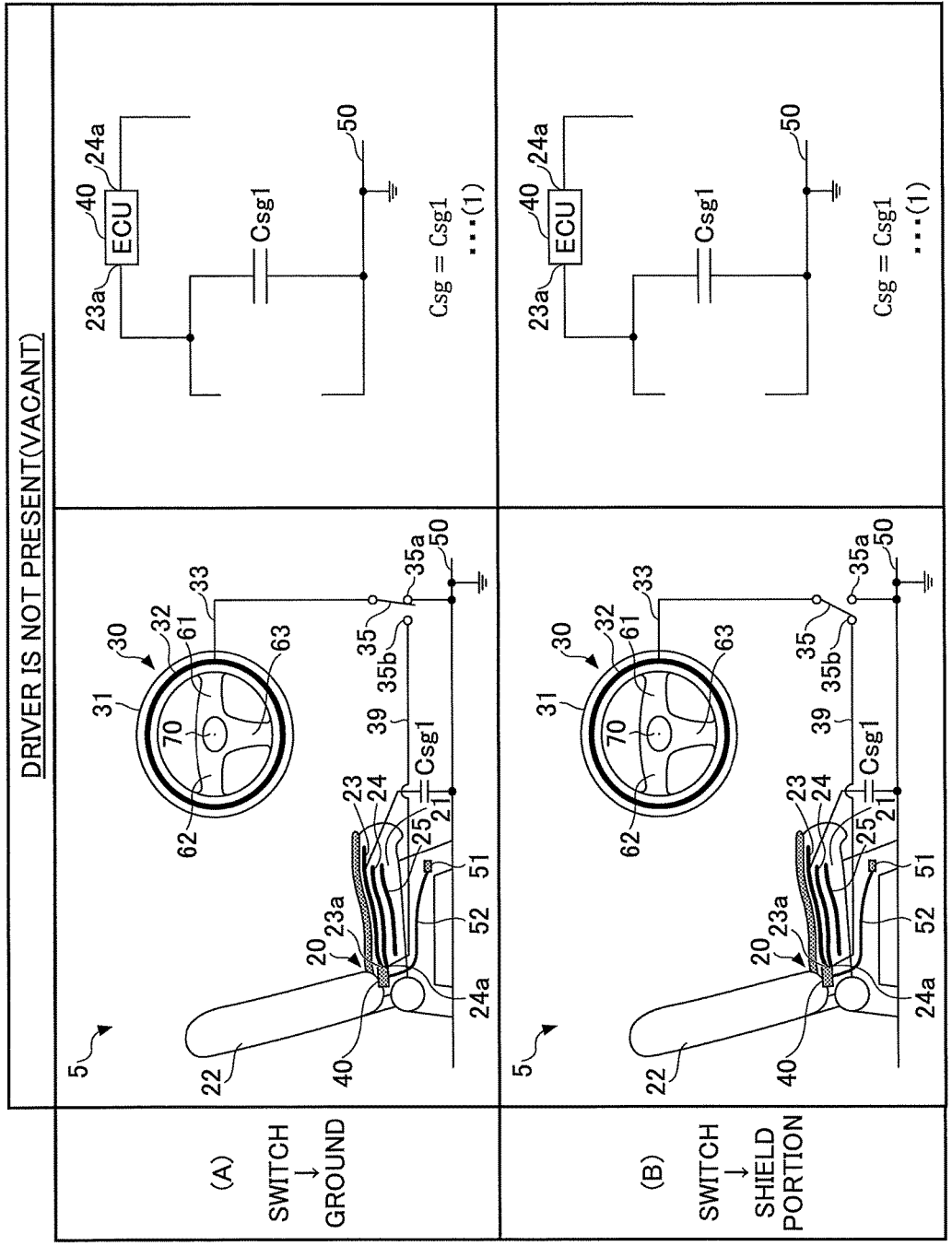
FIG. 14 is a view illustrating an example of an electrical circuit and its equivalent circuit formed when a seat is vacant.
Figure 15:
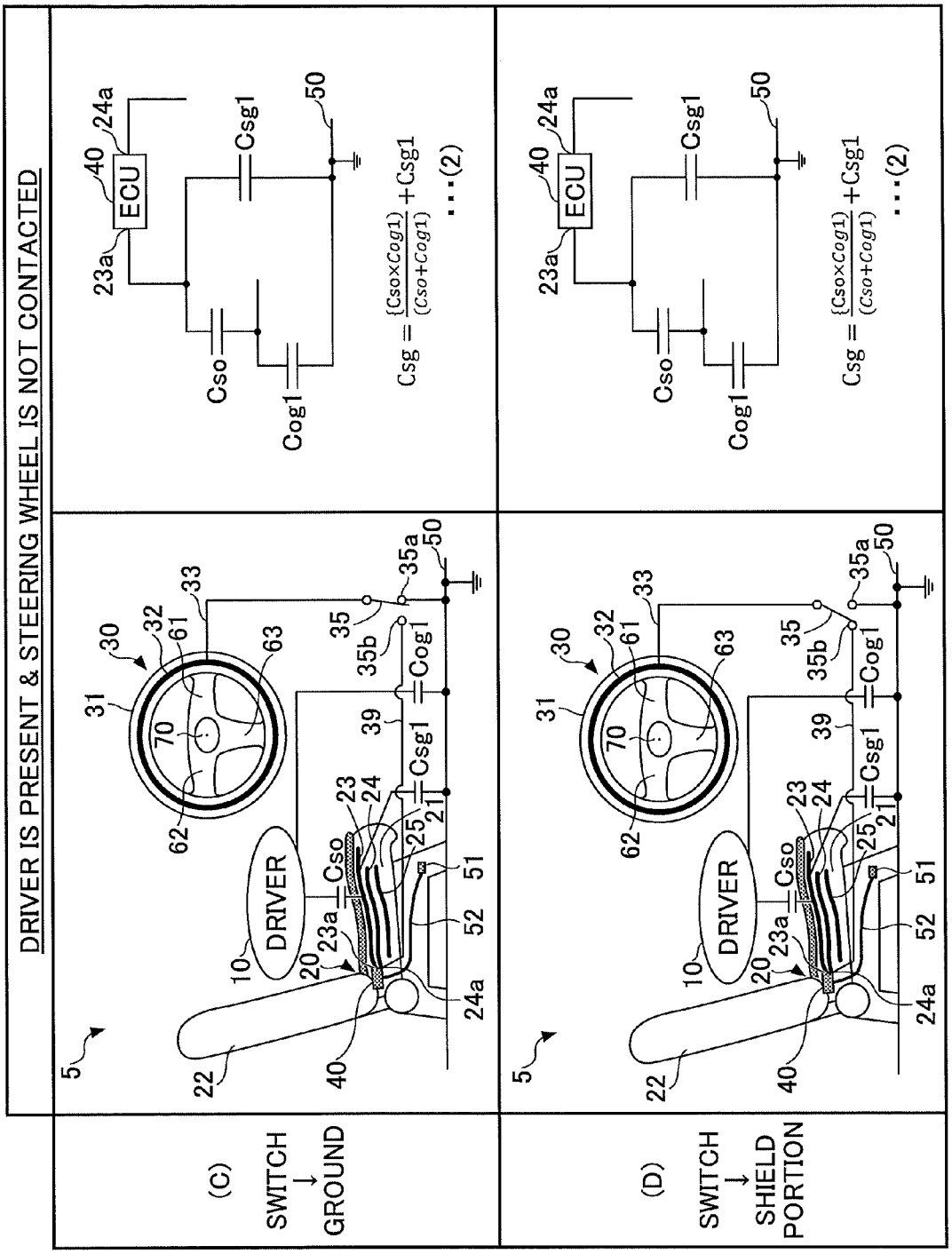
FIG. 15 is a view illustrating an example of an electrical circuit and its equivalent circuit formed when the seat is seated, and a steering wheel is not contacted.
Figure 16:
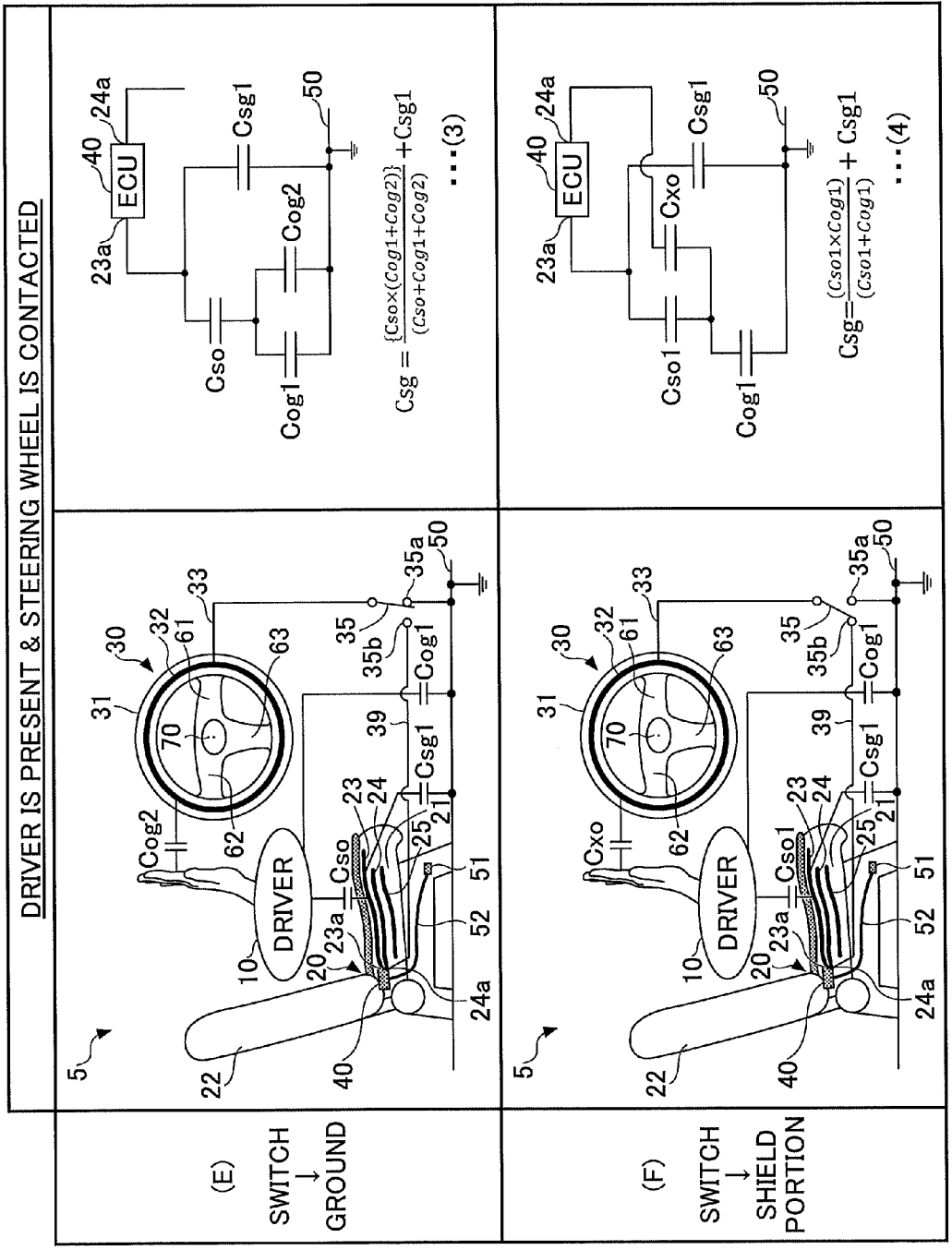
FIG. 16 is a view illustrating an example of an electrical circuit and its equivalent circuit formed when the seat is seated, and the steering wheel is contacted.

FIG. 14 is a view illustrating an example of an electrical circuit and its equivalent circuit that is formed when the seat 20 is vacant. (A) illustrates a state in which the switch 35 is switched to the ground contact 35a at the nonpresence status, and (B) illustrates a state in which the switch 35 is switched to the shield contact 35b at the nonpresence status. FIG. 15 is a view illustrating an example of an electrical circuit and its equivalent circuit that is formed when the seat 20 is seated, and the steering wheel 30 is not contacted. (C) illustrates a state in which the switch 35 is switched to the ground contact 35a at the presence & non-contacting status, and (D) illustrates a state in which the switch 35 is switched to the shield contact 35b at the presence & non-contacting status. FIG. 16 is a view illustrating an example of an electrical circuit and its equivalent circuit that is formed when the seat 20 is seated, and the steering wheel is 30 contacted. (E) illustrates a state in which the switch 35 is switched to the ground contact 35a at the presence & contacting status, and (F) illustrates a state in which the switch 35 is switched to the shield contact 35b at the presence & contacting status.

At each of the "nonpresence status" of FIG. 14 and the "presence & non-contacting status" of FIG. 15, the measurement values of the combined capacitance Csg do not change under the state in which the switch 35 is switched to the ground contact 35a (the state (A) or (C)), and under the state in which the switch 35 is switched to the shield contact 35b (the state (B) or (D)).

On the other hand, at the "presence & contacting status" of FIG. 16, under the state in which the switch 35 is switched to the ground contact 35a as the state (E), the capacitance Cog2 is formed between the driver 10 and the steering electrode 32. Thus, at the "presence & contacting status", and under the state (E), the combined capacitance Csg between the ground 50 and the seat electrode 23 can be expressed as an equation (3) in FIG. 16. In other words, the combined capacitance Csg expressed by the equation (3) in FIG. 16 under the state (E) becomes higher than the combined capacitance Csg expressed by an equation (2) in FIG. 15 under the state (C).

Meanwhile, at the "presence & contacting status" of FIG. 16, under the state in which the switch 35 is switched to the shield contact 35b as the state (F), the capacitance Cxo is formed between the driver 10 and the steering electrode 32. Here, under the state (F), the steering electrode 32 is connected to the shield portion 24 via the switch 35. Thus, the capacitance Cxo corresponds to capacitance between the driver 10 and the shield portion 24, and the ECU 40 that measures the combined capacitance Csg between the ground 50 and the seat electrode 23 does not measure (detect) this capacitance. In other words, as expressed in an equation (4), the combined capacitance Csg measured by the ECU 40 does not include the capacitance Cxo. Further, capacitance charged between a person and another site is invariable. Thus, the capacitance between the seat electrode 23 and the driver 10 is reduced to Cso1 from Cso due to generation of the capacitance Cxo. In other words, in the state (F), the capacitance Cxo is additionally generated with respect to the state of (D) of FIG. 15. Thus, the capacitance Cso at the state (D) is divided into the capacitance Cso1 and the capacitance Cxo at the state (E) (Cso=Cso1+Cxo). Thus, the capacitance between the seat electrode 23 and the driver 10 is reduced to Cso1 from Cso due to the generation of the capacitance Cxo.

Thus, at the "presence & contacting status", and under the state (F), the combined capacitance Csg between the ground 50 and the seat electrode 23 can be expressed as an equation (4) in FIG. 16. In other words, the combined capacitance Csg expressed by the equation (4) in FIG. 16 under the state (F) becomes lower than the combined capacitance Csg expressed by an equation (3) in FIG. 16 under the state (E).

As such, values of the combined capacitance Csg are different for the three statuses illustrated in FIG. 14 to FIG. 16, and becomes larger in order of the equations (1), (4), (2) and (3) (in other words, (1)<(4)<(2)<(3)). Thus, the ECU 40 can distinguish and detect the nonpresence status, the presence & non-contacting status and the presence & contacting status based on the measurement values of the combined capacitance Csg between the ground 50 and the seat electrode 23.

Figure 17:
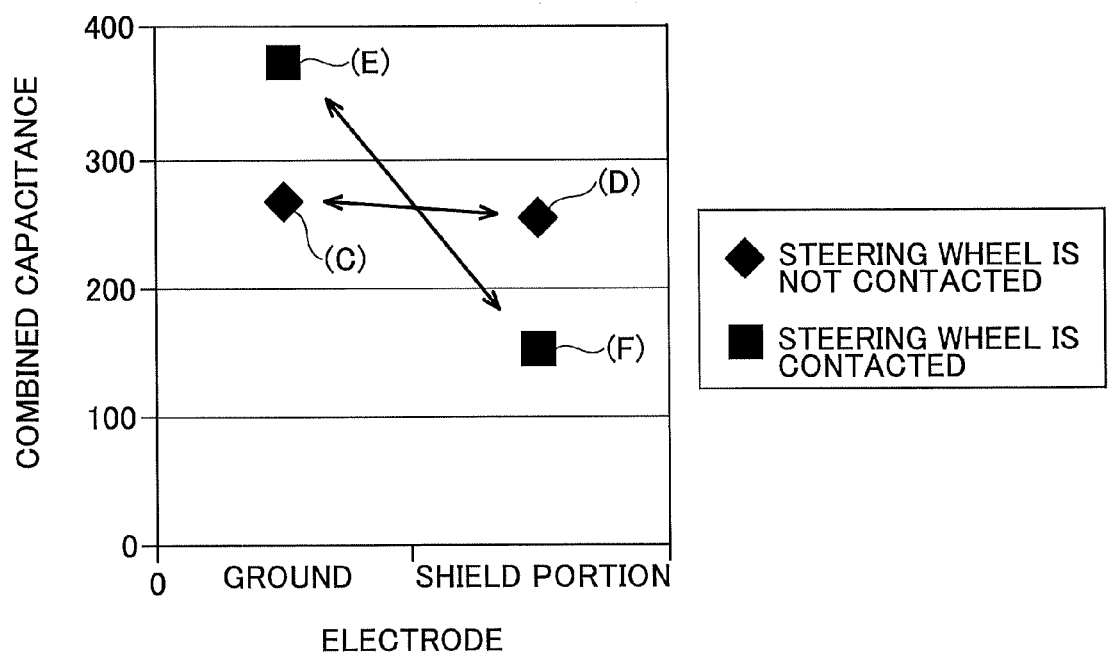
FIG. 17 is a view illustrating an example of a difference in measurement values of combined capacitance at different states.

FIG. 17 is a view illustrating an example of the difference in the measurement values of the combined capacitance Csg at the different states. As illustrated in FIG. 17, in particular, a difference between values of the combined capacitance Csg at the state (E) and the state (F) (at the presence & contacting status) is relatively large. Thus, the ECU 40 can easily detect that there is the difference between the measurement values of the combined capacitance Csg under the state in which the switch 35 is switched to the ground contact 35a (E) and the state in which the switch 35 is switched to the shield contact 35b (F). Thus, the ECU 40 can determine that the driver 10 and the steering wheel 30 are contacted with high accuracy.

Figure 18:
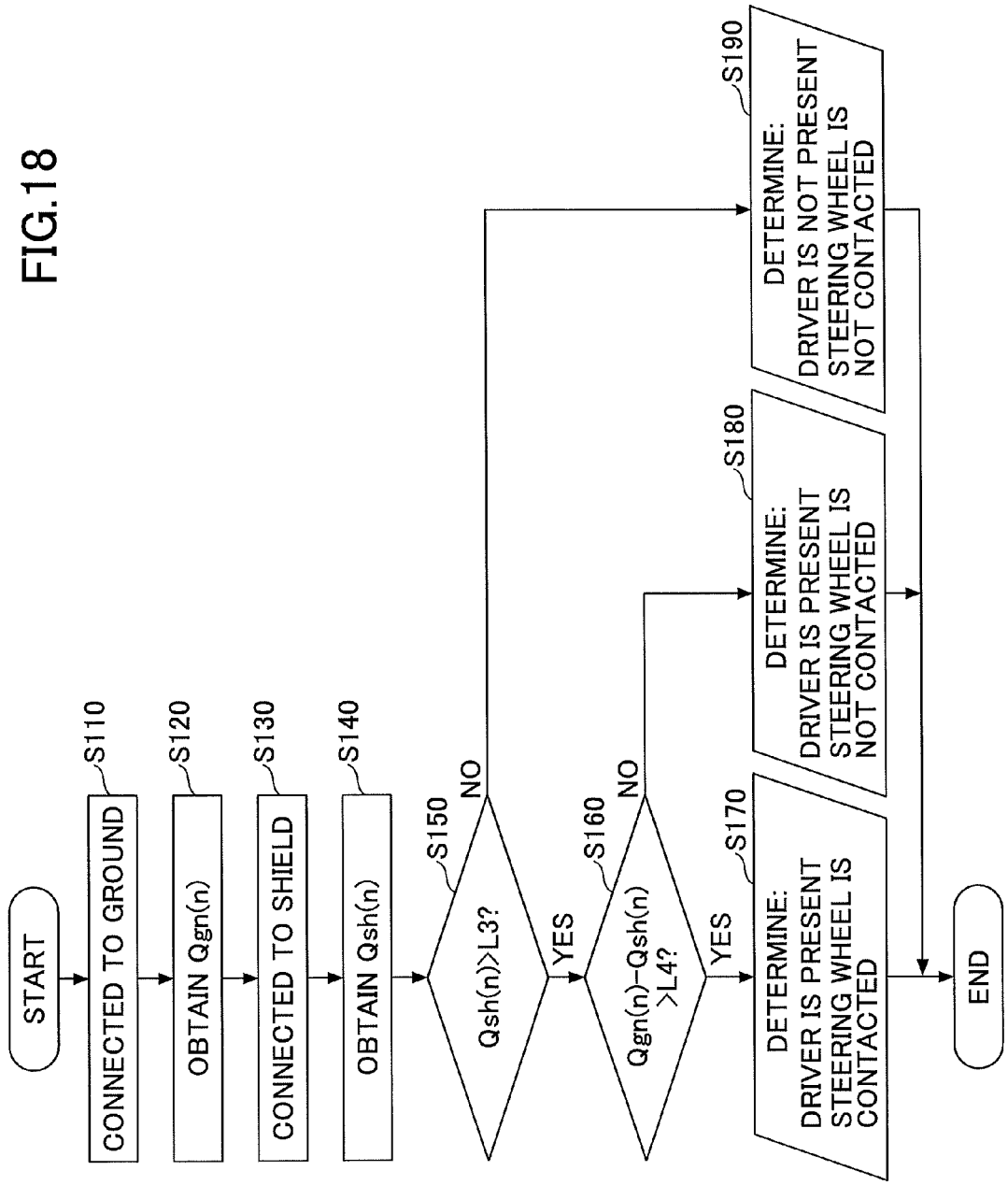
FIG. 18 is a flowchart illustrating an example of an operation of a detection device.

FIG. 18 is a flowchart illustrating an example of an operation of the ECU 40. The ECU 40 repeatedly performs processes between start to end at a predetermined period. When an ignition switch is on, the ECU 40 whose poser source is on starts the processes illustrated in FIG. 18.

In step S110, the detection unit 43 outputs a ground connection command signal which causes the switch 35 to be connected to the ground contact 35a. In step S120, the detection unit 43 obtains a quadrature component Q (=Qgn(n)) under the state in which the switch 35 is switched to the ground contact 35a from the quadrature demodulator 42. For example, the detection unit 43 obtains the quadrature component Q (=Qgn(n)) when outputting the ground connection command signal from the quadrature demodulator 42.

In step S130, the detection unit 43 outputs a shield connection command signal which causes the switch 35 to be connected to the shield contact 35b. In step S140, the detection unit 43 obtains a quadrature component Q (=Qsh(n)) under the state in which the switch 35 is switched to the shield contact 35b from the quadrature demodulator 42. For example, the detection unit 43 obtains the quadrature component Q (=Qsh(n)) when outputting the shield connection command signal from the quadrature demodulator 42.

In step S150, the detection unit 43 determines whether the quadrature component Qsh(n) obtained in step S140 is greater than a first predetermined value L3. When it is determined that the quadrature component Qsh(n) is less than or equal to the first predetermined value L3 (NO of step S150), the detection unit 43 determines that the current status is the nonpresence status (step S190). On the other hand, when it is determined that the quadrature component Qsh(n) is greater than the first predetermined value L3 (YES of step S150), the detection unit 43 performs a process of step S160.

In step S160, the detection unit 43 determines whether "Qgn(n)−Qsh(n)" is greater than a second predetermined value L4. When it is determined that the "Qgn(n)−Qsh(n)" is less than or equal to the second predetermined value L4 (NO of step S160), the detection unit 43 detects that there is no difference between the measurement values of the combined capacitance Csg under the state in which the switch 35 is switched to the ground contact 35a and the state in which the switch 35 is switched to the shield contact 35b. When it is determined that there is no difference between the measurement values of the combined capacitance Csg in step S160, the detection unit 43 determines that the current status is the presence & non-contacting status (step S180).

Meanwhile, when it is determined that the "Qgn(n)−Qsh(n)" is greater than the second predetermined value L4 (YES of step S160), the detection unit 43 detects that there is a difference between the measurement values of the combined capacitance Csg under the state in which the switch 35 is switched to the ground contact 35a and the state in which the switch 35 is switched to the shield contact 35b. When it is determined that there is a difference between the measurement values of the combined capacitance Csg in step S160, the detection unit 43 determines that the current status is the presence & contacting status (step S170).

Here, although whether the quadrature component Qsh(n) obtained in step S140 is greater than the first predetermined value L3 is determined in step S150 in the above description, instead of the quadrature component Qsh(n) obtained in step S140, the quadrature component Qgn(n) obtained in step S120 may be used. In such a case, whether the quadrature component Qgn(n) is greater than a predetermined value may be determined in step S150. Then, when the quadrature component Qgn(n) is less than or equal to the predetermined value, the process may proceed to step S190, and when the quadrature component Qgn(n) is greater than the predetermined value, the process may proceed to step S160.

Here, the first predetermined value L3 and the second predetermined value L4 may be threshold values those are set without considering the above described in-phase component I, or may be threshold values corrected in accordance with the in-phase component I as illustrated in FIG. 6. Further, the first predetermined value L3 and the second predetermined value L4 of the fifth embodiment may be different from the first predetermined value L3 and the second predetermined value L4 of the second embodiment, respectively.

As such, according to the detection system 5 as well, the presence/nonpresence of the driver 10 on the seat 20 and the contact/noncontact between the driver 10 and the steering wheel 30 can be detected by the common single ECU 40. Thus, cost of the detection system 5 can be reduced, and it is easier to mount the detection system 5 on the vehicle. Further, according to the detection system 5, even when the driver 10' changes his/her position on the seat 20 while touching the rim 31, the contact/noncontact between the driver 10 and the steering wheel 30 can be easily detected.

(Sixth Embodiment)

Figure 19:
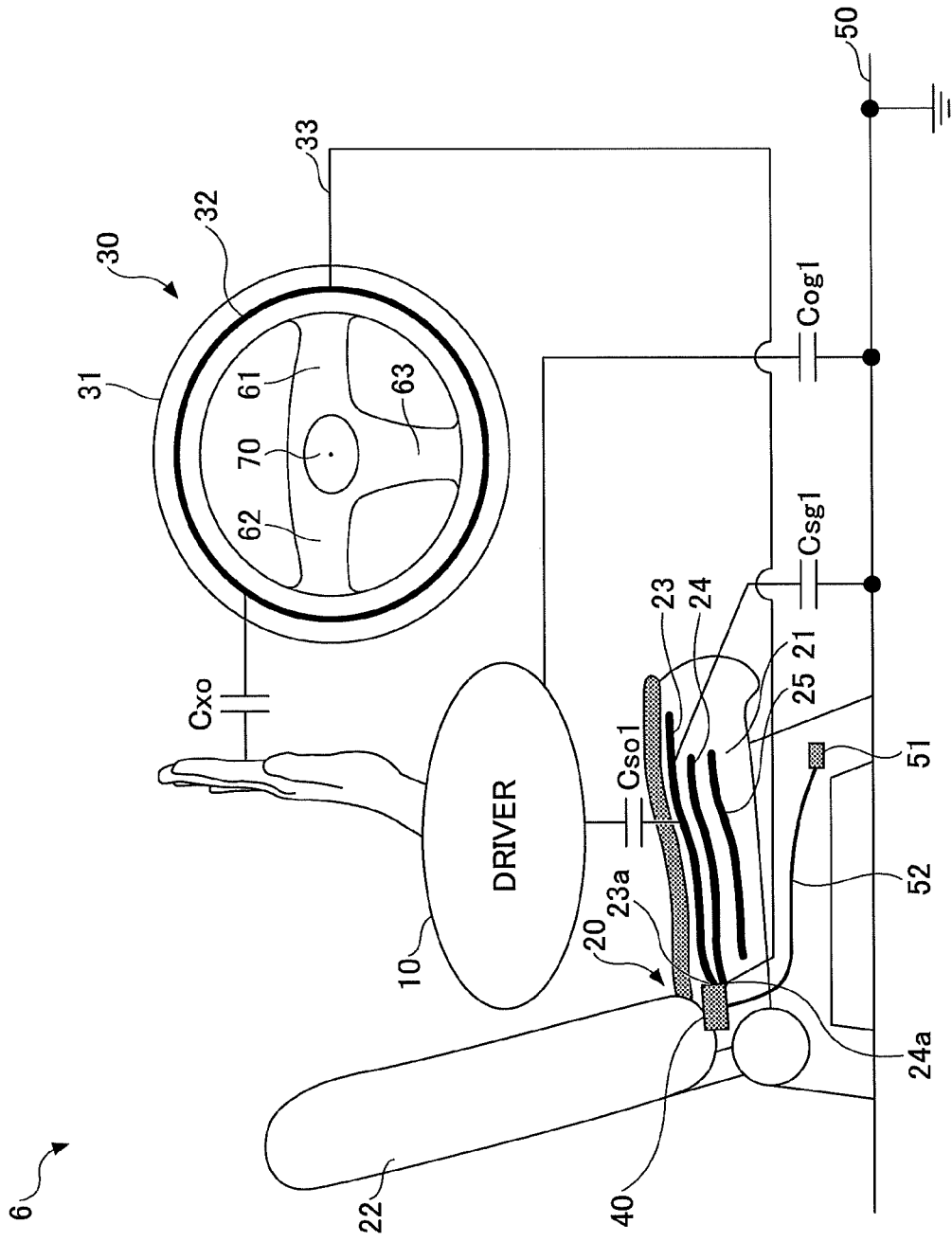
FIG. 19 is a view schematically illustrating an example of a structure of a detection system of a sixth embodiment.

FIG. 19 is a view schematically illustrating an example of a structure of a detection system 6 of a sixth embodiment. In the sixth embodiment, the same structures and the same effects as those of the above described embodiments may also be applicable and are not repeatedly described.

According to the detection system 1 (see FIG. 1), it is described that the steering electrode 32 is always connected to the ground 50 via the connection line 33. Here, according to the detection system 6 (see FIG. 19), the steering electrode 32 is always connected to the shield portion 24 via the connection line 33.

In the detection system 6, the nonpresence status is equal to the state (B) in FIG. 14. Thus, at the nonpresence status, the combined capacitance Csg between the ground 50 and the seat electrode 23 can be expressed as the equation (1) in FIG. 14. The presence & non-contacting status is equal to the state (D) in FIG. 15. Thus, at the presence & non-contacting status, the combined capacitance Csg between the ground 50 and the seat electrode 23 can be expressed as the equation (2) in FIG. 15. The presence & contacting status is equal to the state (F) in FIG. 16. Thus, at the presence & contacting status, the combined capacitance Csg between the ground 50 and the seat electrode 23 can be expressed as the equation (4) in FIG. 16.

As can be understood from the equations (1), (2) and (4), values of the combined capacitance Csg are different for the three statuses, and becomes larger in order of the equations (1), (4) and (2) (in other words, (1)<(4)<(2)). Thus, the ECU 40 can distinguish and detect the nonpresence status, the presence & non-contacting status and the presence & contacting status based on the measurement values of the combined capacitance Csg between the ground 50 and the seat electrode 23.

For example, when the quadrature component Q is less than a third threshold value Th3, the detection unit 43 determines that the current status is the nonpresence status. When the quadrature component Q is greater than or equal to the third threshold value Th3 and less than a fourth threshold value Th4, the detection unit 43 determines that the current status is the presence & contacting status. When the quadrature component Q is greater than or equal to the fourth threshold value Th4, the detection unit 43 determines that the current status is the presence & non-contacting status. The third threshold value Th3 is set to be a value between a right-side value of the equation (1) in FIG. 14 and a right-side value of the equation (4) in FIG. 16. The fourth threshold value Th4 is set to be a value between the right-side value of the equation (4) in FIG. 16 and a right-side value of the equation (2) in FIG. 15.

In addition, similar to the first embodiment, the detection unit 43 may distinguish and detect the nonpresence status, the presence & non-contacting status and the presence & contacting status using FIG. 6 and the like.

(Seventh Embodiment)

Figure 20:
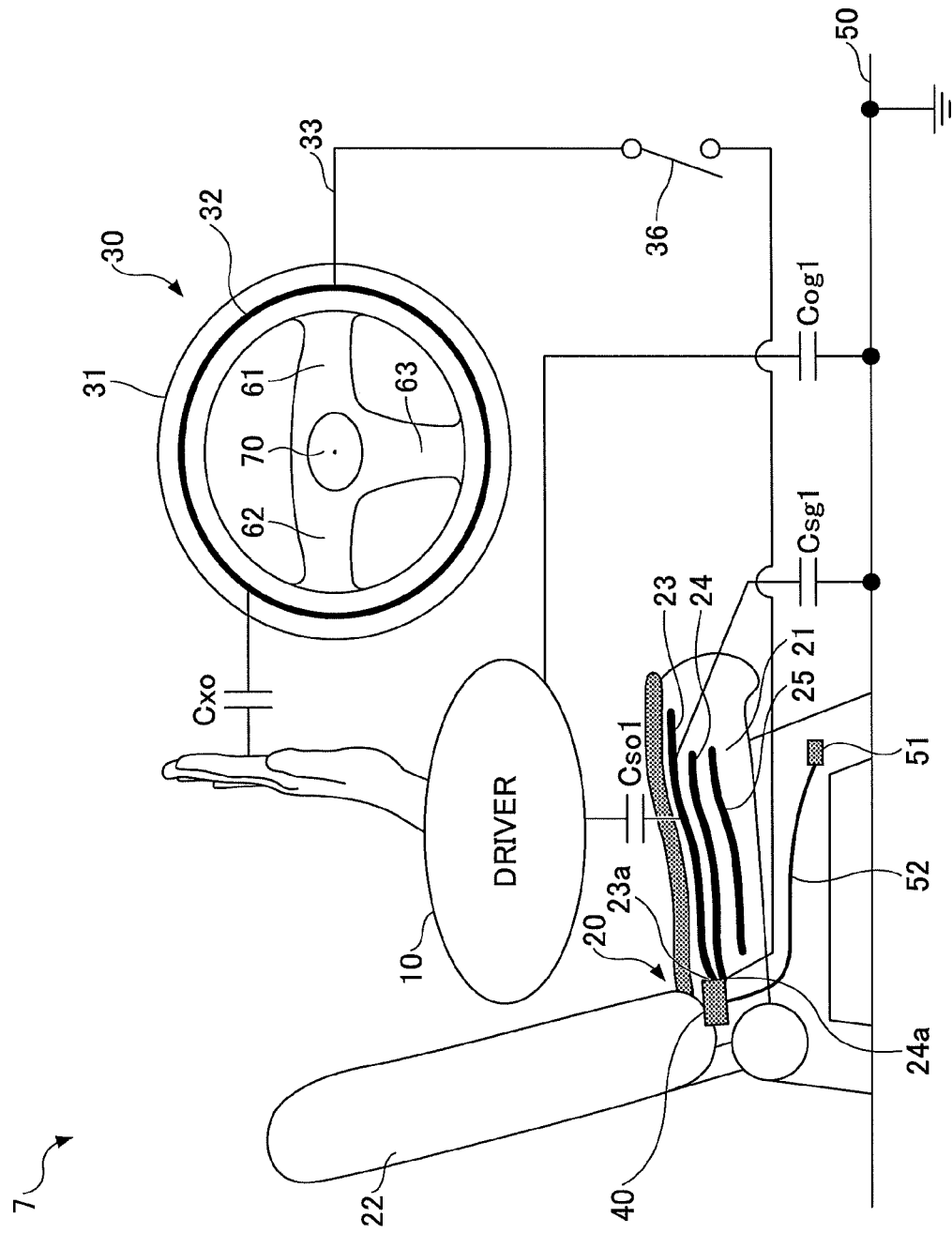
FIG. 20 is a view schematically illustrating an example of a structure of a detection system of a seventh embodiment.

FIG. 20 is a view schematically illustrating an example of a structure of a detection system 7 of a seventh embodiment. In the seventh embodiment, the same structures and the same effects as those of the above described embodiments may also be applicable and are not repeatedly described.

The detection system 2 (see FIG. 7) includes the switch 34 that is inserted between the steering electrode 32 and the ground 50. Here, the detection system 7 (see FIG. 20) includes a switch 36 inserted between the steering electrode 32 and the shield portion 24. The switch 36 is inserted in the connection line 33 in series so that the switch 36 can shut down or connect the steering electrode 32 and the shield portion 24. In this embodiment, the steering electrode 32 and the shield portion 24 are connected under a state in which the switch 36 is on, and the steering electrode 32 and the shield portion 24 are shut down under a state in which the switch 36 is off.

Under a status in which the driver 10 and the steering wheel 30 contact, as the capacitance Cxo changes under a state in which the switch 36 is on and a state in which the switch 36 is off, the measurement value of the combined capacitance Csg is also changed. Meanwhile, under a status in which the driver 10 and the steering wheel 30 do not contact, as the capacitance Cxo is not formed, the measurement value of the combined capacitance Csg does not change under a state in which the switch 36 is on and a state in which the switch 36 is off.

Based on this point, the ECU 40 compares the measurement values of the combined capacitance Csg when the switch 36 is on and when the switch 36 is off, and detects the contact/noncontact between the driver 10 and the steering wheel 30 based on the compared result.

For example, when it is detected that there is a difference between the measurement values of the combined capacitance Csg when the switch 36 is on and when the switch 36 is off, the ECU 40 determines that the driver 10 and the steering wheel 30 contact. On the other hand, when it is determined that there is no difference between the measurement values of the combined capacitance Csg when the switch 36 is on and when the switch 36 is off, the ECU 40 determines that the driver 10 and the steering wheel 30 do not contact.

By substituting the switch 36 for the switch 34 in the above described description with reference to FIG. 9, the ECU 40 of the seventh embodiment can distinguish and detect the nonpresence status, the presence & non-contacting status and the presence & contacting status according to the determining method illustrated in FIG. 9.

According to the embodiment, as a presence of a person on a seat and a contact of the person and an operation unit are detected by a common detection device, cost of a detection system can be reduced, and it is easier to mount the detection system on the vehicle.

Although a preferred embodiment of the detection system has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, in the fifth to seventh embodiments, the seat electrode 23 may be provided at the seat back 22 as illustrated in FIG. 10 or FIG. 11.

Further, for example, the seat electrode 23 may be provided at a headrest of the seat 20, not limited to the seat portion 21 or the seat back 22. Further, two or more of the seat electrodes 23 may be provided at two or more positions among the seat portion 21, the seat back 22 and the headrest.

Further, according to the above described embodiments, as the steering electrode 32 is provided at the rim 31, the ECU 40 detects a contact between the driver 10 and the rim 31. However, the steering electrode 32 may be provided at a position other than the rim 31 of the steering wheel 30. For example, the steering electrode 32 may be provided at the spoke or at an operation switch provided at the spoke. In such a case, the ECU 40 can detect a contact between the driver 10 and the spoke or the operation switch provided at the spoke.

Further, although the steering wheel 30 is exemplified as an example of the operation unit that is provided in the vehicle and is touched and operated in the above embodiments, the operation unit is not limited so. For example, the operation unit may be a seat belt for binding a person, a tongue attached to a seat belt, a buckle connected to the tongue or the like. Further, the operation unit may be an operation switch, a sun visor, a rear-view mirror or the like provided at an instrument panel, a ceiling or the like. Further, the operation unit may be an operation lever such as a shift lever, a winker lever, a wiper lever or a cruise control switch lever. Further, the operation unit may be a door grip for opening and closing a door of the vehicle, an operation switch for opening and closing a window of the vehicle, an operation switch for locking and unlocking the door of the vehicle or the like.

Further, the operation unit that is touched and operated is not limited to a member that is touched and operated by a hand, and may be a member that is touched and operated by another portion of a human body such as a foot. For example, the operation unit may be a foot pedal (a brake pedal, a gas pedal, a clutch pedal or the like, for example) that is operated by being stepped by the driver 10 for operating the vehicle.

For example, the seat of the vehicle on which a person sits is not limited to a driver seat on which a driver sits, and may be a seat (an assistant driver's seat, a back seat, for example) for a passenger other than the driver.

What is claimed is:

1. A detection system comprising:
a first electrode provided at a seat of a vehicle;
a second electrode provided at an operation unit which is operated by being contacted, the second electrode being connected to a reference potential portion; and
a detection device configured to measure a combined capacitance between the reference potential portion and the first electrode and detects a presence of a person on the seat, and a contact between the person and the operation unit based on a measurement value of the combined capacitance;
wherein the combined capacitance includes a capacitance between the first electrode and the reference potential portion, a capacitance between the first electrode and the person on the seat, a capacitance between the person on the seat and the reference potential portion, and a capacitance between the person on the seat and the second electrode.

2. The detection system according to claim 1, wherein the detection device determines, based on the measurement value, a current status as either one of (i) nonpresence and non-contacting, (ii) presence and non-contacting, and (iii) presence and contacting.

3. The detection system according to claim 2, wherein the detection device determines the current status as
(i) nonpresence and non-contacting when the measurement value is less than a first threshold value,
(ii) presence and non-contacting when the measurement value is greater than or equal to the first threshold value and less than a second threshold value, and
(iii) presence and contacting when the measurement value is greater than or equal to the second threshold value.

4. The detection system according to claim 1, further comprising:
a switch, inserted between the second electrode and the reference potential portion, that connects the second electrode and the reference potential portion when turned on, and does not connect the second electrode and the reference potential portion when turned off,
wherein the detection device detects whether the person and the operation unit are contacted or not based on a compared result of the measurement value at the time when the switch is on and the measurement value at the time when the switch is off.

5. The detection system according to claim 4, wherein the detection device determines a current status as
(i) nonpresence and non-contacting when the measurement value at the time when the switch is off is less than or equal to a first predetermined value,
(ii) presence and non-contacting when the measurement value at the time when the switch is off is greater than the first predetermined value, and a difference between the measurement value at the time when the switch is on and the measurement value at the time when the switch is off is less than or equal to a second predetermined value, and
(iii) presence and contacting when the measurement value at the time when the switch is off is greater than the first predetermined value, and the difference is greater than the second predetermined value.

6. The detection system according to claim 4, wherein the detection device determines a current status as
without the contact when it is detected that there is no difference between the measurement value at the time when the switch is on and the measurement value at the time when the switch is off, and
with the contact when it is detected that there is the difference.

7. The detection system according to claim 1, further comprising:
a shield portion that shields the first electrode; and
a switch that connects the second electrode to either one of the reference potential portion and the shield portion,
wherein the detection device detects whether the person and the operation unit are contacted or not based on a compared result of the measurement value at the time when the second electrode and the reference potential portion are connected by the switch, and the measurement value at the time when the second electrode and the shield portion are connected by the switch.

8. The detection system according to claim 7, wherein the detection device determines a current status as
without the contact when it is detected that there is no difference between the measurement value at the time when the second electrode and the reference potential portion are connected by the switch and the measurement value at the time when the second electrode and the shield portion are connected by the switch, and
with the contact when it is detected that there is the difference.

9. The detection system according to claim 1, wherein the seat is a driver seat, and the operation unit is a steering wheel.

10. A detection system comprising:
a first electrode provided at a seat of a vehicle;
a shield portion that shields the first electrode;
a second electrode provided at an operation unit which is operated by being contacted, the second electrode being selectively connected to the shield portion or a reference potential portion; and a detection device configured to measure a combined capacitance between the reference potential portion and the first electrode and detects a presence of a person on the seat, and a contact between the person and the operation unit based on a measurement value of the combined capacitance;

wherein the combined capacitance includes a capacitance between the first electrode and the reference potential portion, a capacitance between the first electrode and the person on the seat, a capacitance between the person on the seat and the reference potential portion, and a capacitance between the person on the seat and the second electrode.

11. The detection system according to claim 10, further comprising:
a switch, inserted between the second electrode and the shield portion, that connects the second electrode and the shield portion when turned on, and does not connect the second electrode and the shield portion when turned off, wherein the detection device detects whether the person and the operation unit are contacted or not based on a compared result of the measurement value at the time when the switch is on and the measurement value at the time when the switch is off.

12. The detection system according to claim 11, wherein the detection device determines a current status as without the contact when it is detected that there is no difference between the measurement value at the time when the switch is on and the measurement value at the time when the switch is off, and with the contact when it is detected that there is the difference.

13. The detection system according to claim 10, wherein the seat is a driver seat, and the operation unit is a steering wheel.

* * * * *